(12) United States Patent
Kimura et al.

(10) Patent No.: US 9,948,059 B2
(45) Date of Patent: Apr. 17, 2018

(54) SEMICONDUCTOR LASER LIGHT SOURCE AND FABRICATION METHOD

(71) Applicant: FUJITSU LIMITED, Kawasaki-shi, Kanagawa (JP)

(72) Inventors: Tokuharu Kimura, Isehara (JP); Tsuyoshi Yamamoto, Zama (JP); Kazumasa Takabayashi, Atsugi (JP); Ayahito Uetake, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/384,588

(22) Filed: Dec. 20, 2016

(65) Prior Publication Data

US 2017/0104309 A1    Apr. 13, 2017

Related U.S. Application Data

(63) Continuation of application No. PCT/JP2014/066568, filed on Jun. 23, 2014.

(51) Int. Cl.
*H01S 5/026* (2006.01)
*H01S 5/343* (2006.01)
(Continued)

(52) U.S. Cl.
CPC .......... *H01S 5/026* (2013.01); *H01S 5/0425* (2013.01); *H01S 5/227* (2013.01); *H01S 5/2275* (2013.01); *H01S 5/34313* (2013.01)

(58) Field of Classification Search
CPC ........ H01S 5/026; H01S 5/2275; H01S 5/227; H01S 5/34313
See application file for complete search history.

(56) References Cited

U.S. PATENT DOCUMENTS

2012/0321244 A1* 12/2012 Suzuki ................ G02B 6/305
385/14
2016/0322787 A1* 11/2016 Takabayashi .......... H01S 5/026

FOREIGN PATENT DOCUMENTS

JP    H06-174982    6/1994
JP    H06-334268    12/1994
(Continued)

OTHER PUBLICATIONS

K. Goshima, et al.; "1.3-μm Quantum Dot Distributed Feedback Laser with Half-Etched Mesa Vertical Grating Fabricated by Cl2 Dry Etching;" Japanese Journal of Applied Physics; vol. 52; 2013; pp. 06GE03-1-06GE03-4 and cover sheet (5 Sheets)/Cited in International Search Report.
(Continued)

*Primary Examiner* — Dung Nguyen
(74) *Attorney, Agent, or Firm* — Kratz, Quintos & Hanson, LLP

(57) ABSTRACT

A semiconductor laser light source includes a semiconductor substrate formed of a first conductivity type semiconductor material, a lower cladding layer formed of the first conductivity type semiconductor material on the semiconductor substrate, a waveguide layer on the lower cladding layer, and an upper cladding layer formed of a second conductivity type semiconductor material on the waveguide layer. The waveguide layer includes a core area and rib areas thinner than the core area on either side of the core area. The core area has a quantum dot active layer, and the rib areas have no quantum dot layer. The waveguide layer forms a laser part having the core area with a constant width and a spot size converter having the core area with a taper width from a side adjacent to the laser part toward an end of the spot size converter.

18 Claims, 36 Drawing Sheets

(51) Int. Cl.
 *H01S 5/042* (2006.01)
 *H01S 5/227* (2006.01)

(56) References Cited

FOREIGN PATENT DOCUMENTS

| JP | H08-236853 | 9/1996 |
| JP | H09-023039 | 1/1997 |
| JP | H10-056239 | 2/1998 |
| JP | H11-068221 | 3/1999 |
| JP | 2004-179206 A1 | 6/2004 |
| JP | 2006-229010 A1 | 8/2006 |
| JP | 2008-091420 A1 | 4/2008 |
| JP | 2009-117539 A1 | 5/2009 |

OTHER PUBLICATIONS

International Search Report for International Application No. PCT/JP2014/066568 dated Mar. 17, 2015.
Written Opinion of the International Searching Authority for International Application No. PCT/JP2014/066568 dated Mar. 17, 2015 (4 Sheets, 3 Sheets translation, 7 Sheets total).

\* cited by examiner

| STRIPE 0.75-0.30 μm | | |
|---|---|---|
| Material | Al Composition Ratio | Thickness (nm) |
| AlGaAs (14) | 0.15-0.25 | 2300 |
| GaAs (122) | | 20 |
| AlGaAs (121) | 0.15-0.25 | 50-500 |
| GaAs (13a) | | 400 |
| AlGaAs (12) | 0.15-0.25 | 6500 |

| Material | Al Composition Ratio | Thickness (nm) |
|---|---|---|
| AlGaAs (14) | 0.15-0.25 | 2300 |
| GaAs (112) | | 20 |
| AlGaAs (111) | 0.15-0.25 | 400-850 |
| GaAs (13b) | | 50 |
| AlGaAs (12) | 0.15-0.25 | 6500 |

STRIPE 0.75 μm

| Material | Al Composition Ratio | Thickness (nm) |
|---|---|---|
| AlGaAs (14) | 0.15 | 2300 |
| GaAs (122) | | 50 |
| AlGaAs (121) | 0.1–0.35 | 200 |
| GaAs (13a) | | 400 |
| AlGaAs (12) | 0.15 | 6500 |

| Material | Al Composition Ratio | Thickness (nm) |
|---|---|---|
| AlGaAs (14) | 0.15 | 2300 |
| GaAs (112) | | 50 |
| AlGaAs (111) | 0.15 | 550 |
| GaAs (13b) | | 50 |
| AlGaAs (12) | 0.15 | 6500 |

SEMICONDUCTOR LASER LIGHT SOURCE AND FABRICATION METHOD

CROSS-REFERENCE TO RELATED APPLICATIONS

This application is a continuation application of International Application PCT/JP2014/066568 filed on Jun. 23, 2014 and designated the U.S., the entire contents of which are incorporated herein by reference.

FIELD

The disclosures discussed herein relate to a semiconductor laser light source and a fabrication method.

BACKGROUND

Silicon photonics is a technology for integrating silicon-made large-scale integrated circuits (LSIs) and silicon optical semiconductor components, and has recently attracted much attention. In related art LSI technologies, data transfer both between and within central processing units (CPUs) or microchips is performed by using interconnects made of metal such as Cu. In contrast, silicon photonics technology enables optical signal transmission to provide faster, less energy-consuming data transfer between and within CPUs.

In silicon photonics technology, an optical waveguide 920 made of silicon is formed on a surface of a silicon substrate, and a semiconductor laser light source 930 serving as a light source is mounted on the silicon substrate, as illustrated in FIG. 1. As a semiconductor laser light source 930, a compound semiconductor laser is generally used; a quantum-well laser is an example of the compound semiconductor laser. The semiconductor laser light source 930 is directly coupled to the optical waveguide 920 with high coupling efficiency to form a spot size converter to convert a spot size of a laser beam to the enlarged spot size, for example, of approximately 3 μm.

However, in the case of the quantum well laser, the oscillation threshold and the drive current are liable to vary with an environmental temperature of the place on which the semiconductor laser light source 93C is mounted. Specifically, when a CPU or the like is installed in a silicon photonics device, the amount of heat generated by the CPU or the like is large, and heat generated from the CPU or the like is transmitted through the silicon substrate or the like, which makes the environmental temperature high. Thus, it is not preferable to employ the silicon quantum well laser as a light source in a silicon photonics device, because the use of the silicon quantum well laser may change characteristics such as an oscillation threshold and a drive current of the laser, which may result in high energy consumption or failing to provide desired characteristics.

RELATED-ART DOCUMENTS

Patent Documents

Patent Document 1: Japanese Laid-open Patent Publication No. 8-236853
Patent Document 2: Japanese Laid-open Patent Publication No. 6-174982

SUMMARY

Accordingly, it is desirable to provide a semiconductor light source capable of being employed in silicon photonics and exhibiting a low oscillation threshold or less change in a drive current with alteration in environmental temperature. That is, it is desirable to provide a semiconductor laser light source having low temperature dependency in the oscillation threshold current or in the drive current.

According to an aspect of embodiments, there is provided a semiconductor laser light source including a semiconductor substrate formed of a semiconductor material of a first conductivity type; a lower cladding layer over the semiconductor substrate, the lower cladding layer being formed of the semiconductor material of the first conductivity type; a waveguide layer formed on the lower cladding layer; and an upper cladding layer over the waveguide layer, the upper cladding layer being formed of a semiconductor material of a second conductivity type. The waveguide layer includes a core area through which light is guided and rib areas on either side of the core area. Each of the rib areas is thinner than the core area. The core area has a quantum dot active layer, and the rib areas have no quantum dot layer. The waveguide layer forms a laser part and a spot size converter adjacent to the laser part, the spot size converter being configured to convert a spot size of the laser light.

In the waveguide layer, the core area in the laser part has a constant width, and the core area in the spot size converter has a taper width gradually narrowing from a side adjacent to the laser part toward an end of the spot size converter.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

Figure 1:
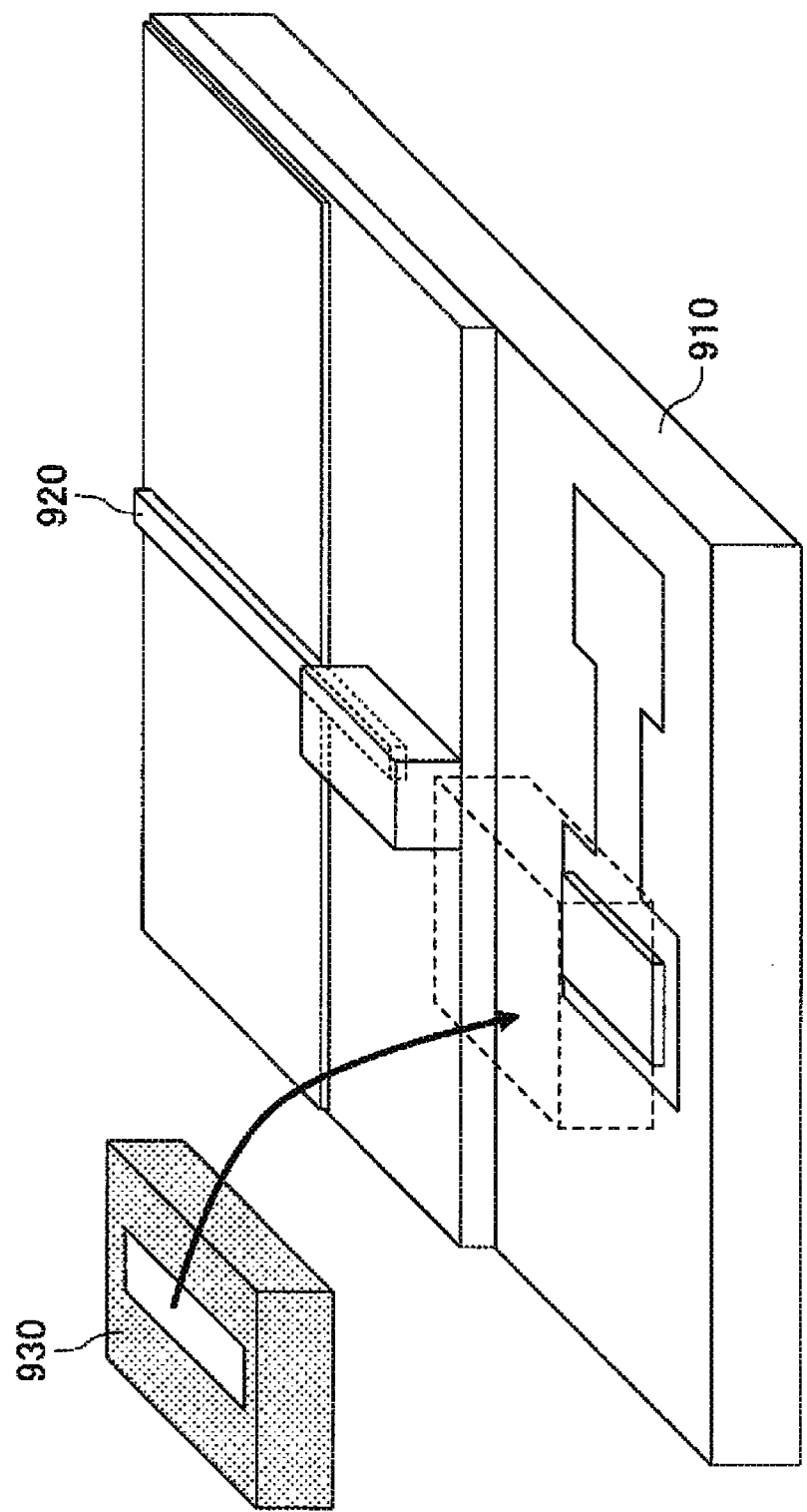
FIG. 1 depicts a diagram illustrating an example of silicon photonics.

In the following, preferred embodiments are described with reference to the accompanying drawings.

The following describes embodiments of the present invention with reference to the accompanying drawings. Note that in the following description, parts that are the same are assigned with the same reference numerals, and descriptions of such parts are omitted.

Figure 2A:
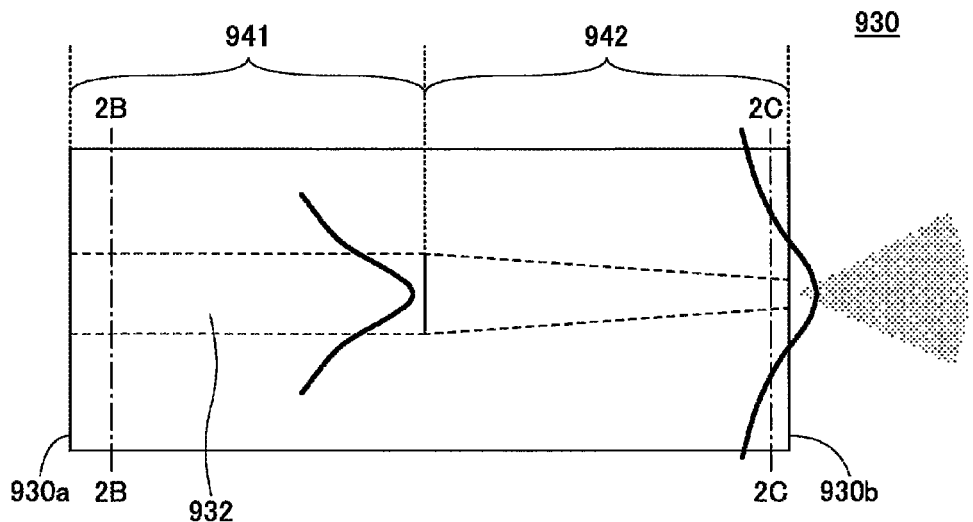
FIGS. 2A to 2C are diagrams illustrating an example of an InP quantum well laser.
Figure 2B:
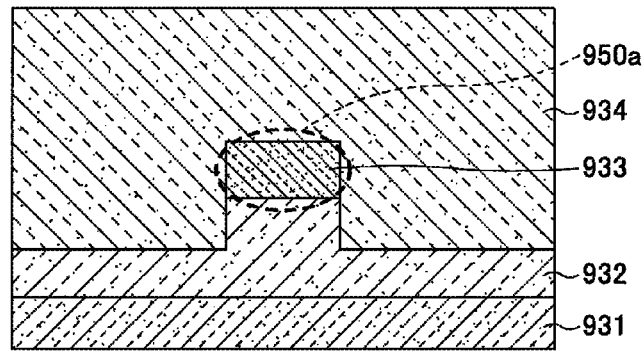
Figure 2C:
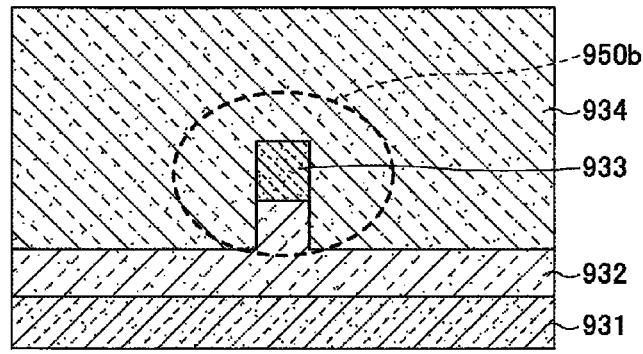

An illustration is first given of an InP-based quantum well laser 930 with reference to FIGS. 2A to 2C as a related-art semiconductor laser light source. FIG. 2A is a top view of the InP-based quantum well laser 930, FIG. 2B is a sectional view cut along a dash-dot line 2B-2B, and FIG. 2C is a sectional view cut along a dash-dot line 2C-2C.

The InP-based quantum well laser 930 includes, as illustrated in FIGS. 2A to 2O, an n-type InP lower cladding layer 932, a quantum well active layer 933, and a p-type InP upper cladding layer 934 that are layered on an n-type InP semiconductor substrate 931. Note that the quantum well active layer 933 includes alternately disposed InGaAsP layers and InP layers. The InP-based quantum well laser 930 includes a laser part 941 and a spot size converter 942. The quantum well active layer 933 in the laser part 941 is formed with a constant width, and the quantum well active layer 933 in the spot size converter 942 is tapered toward an end of the spot size converter 942. A spot size 950a of the laser light in the laser part 941 is enlarged by the spot size converter 942, so that the laser light having an enlarged spot size 950b is emitted.

The InP-based quantum well laser 930 includes a high reflection film on an end face 930a of the laser part 941 and a partial reflection film on an end face 930b of the spot size converter 942. The laser light is thus emitted from the end face 930b having the partial reflection film of the spot size converter 942.

The InP-based quantum well laser 930 illustrated in FIGS. 2A to 2C has high temperature dependency in the oscillation threshold current or driving current as described above. Hence, the InP-based quantum well laser 930 is not preferable because the oscillation threshold current or driving current may drastically be changed by heat generated from the InP-based quantum well laser 930 that is disposed close to a CPU or the like generating a high heating value.

An example of a semiconductor laser having low temperature dependency in the oscillation threshold current or driving current may be a quantum dot laser. Compared to the quantum well laser, the quantum dot laser exceeds in temperature stability. For example, high temperatures cause an excessive current flow in the InP-based quantum well laser 930, and hence, it may be difficult to operate the InP-based quantum well laser 930 at high temperatures. However, an InAs/GaAs-based quantum dot laser has temperature stability, and the threshold current is unlikely to be raised at high temperatures. The InAs/GaAs-based quantum dot laser is thus capable of being operated at 150° C. or above. Accordingly, in silicon photonics, the quantum dot laser is preferable as a semiconductor laser serving as a light source disposed on the silicon substrate having LSIs installed.

FIRST EMBODIMENT

Semiconductor Laser Light Source

Figure 3A:
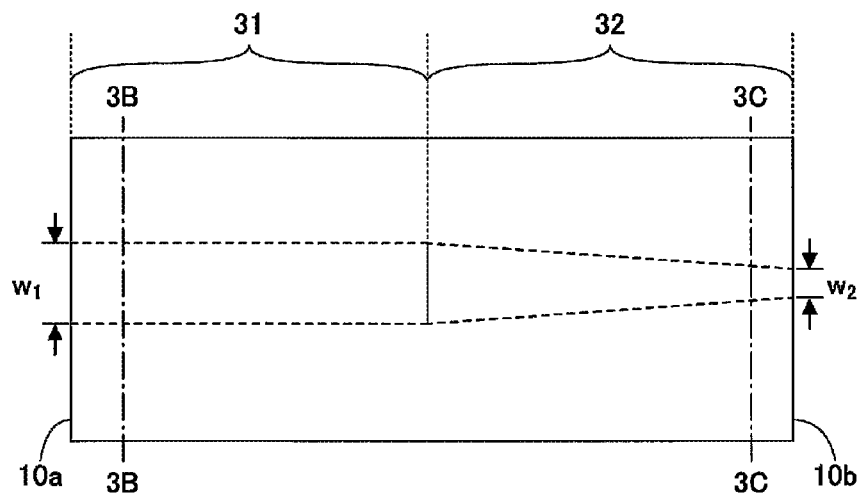
FIGS. 3A to 3C are diagrams illustrating a semiconductor laser light source according to a first embodiment.
Figure 3B:
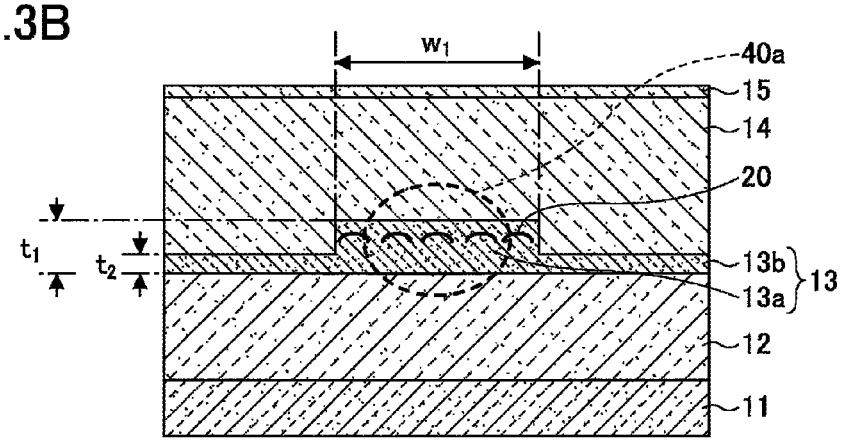
Figure 3C:
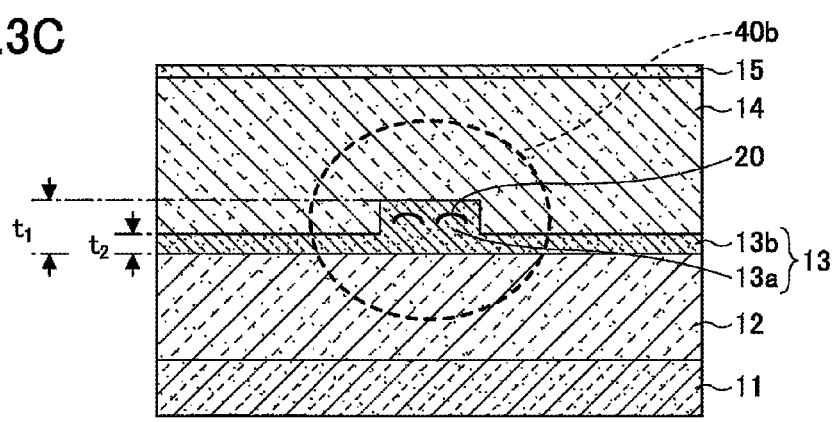

Next, a description is given of a semiconductor laser light source according to a first embodiment with reference to FIGS. 3A to 3C. FIG. 3A is a top view of the semiconductor laser light source according to the first embodiment. FIG. 3B is a sectional view cut along cut along a dash-dot line 3B-3B of FIG. 3A, and FIG. 3C is a sectional view cut along a dash-dot line 3C-3C of FIG. 3A.

As illustrated in FIGS. 3A to 3C, the semiconductor laser light source according to the first embodiment includes a lower cladding layer 12, a waveguide layer 13, an upper cladding layer 14, and a contact layer 15 that are layered on a semiconductor substrate 11. The semiconductor substrate 11 is formed of a p-type GaAs substrate, and the lower cladding layer 12 is formed of p-type AlGaAs.

The waveguide layer 13 includes a core area 13a through which light is guided and rib areas 13b disposed on either side of the core area 13a. In the waveguide layer 13, an InAs/GaAs quantum dot active layer 20 is formed on the core area 13a but the InAs/GaAs quantum dot active layer 20 is not formed on the rib areas 13b. Hence, in the waveguide layer 13, a thickness $t_1$ of the core area 13a is greater than a thickness $t_2$ of the rib areas 13b. Note that in the semiconductor laser light source according to the first embodiment, the core area 13a serves as an active layer.

Figure 4:
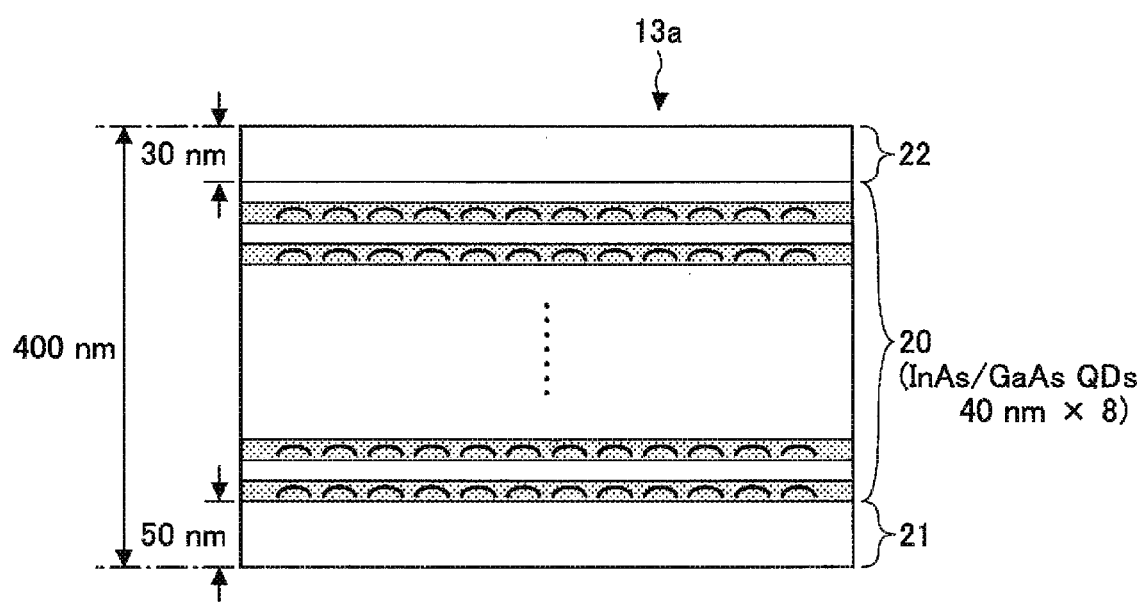
FIG. 4 is a structural diagram illustrating a core area having an InAs/GaAs quantum dot active layer, an upper GaAs layer, and a lower GaAs layer.

In the first embodiment, the core area 13a of the waveguide layer 13 includes a layered stack of a lower GaAs layer 21 having a thickness of 50 nm, the InAs/GaAs quantum dot active layer 20, and an upper GaAs layer 22 having a thickness of 30 nm, as illustrated in FIG. 4. The InAs/GaAs quantum dot active layer 20 includes eight layers stacked one over another via a GaAs layer with a 40 nm period. Each of the eight layers is formed by covering a quantum dot layer having InAs quantum dots on a GaAs layer with a GaAs layer. The thickness t1 of the core area 13a is thus 400 nm, and the thickness t2 of the rib area 13b where no InAs/GaAs quantum dot active layer 20 is formed is 50 nm. The rib areas 13b are formed of the lower GaAs layer 21. Note that it is preferable that the GaAs layer disposed between the quantum dot layers be partially doped with a p-type dopant in order to secure temperature stable operations. Further, a layer formed of InGaAs may be disposed between the InAs quantum dots and the GaAs layer covering the InAs quantum dots in order to adjust the wavelength of laser emission.

The upper cladding layer 14 is formed of n-type AlGaAs, and the contact layer 15 is formed of n-type GaAs. Note that though not illustrated in FIGS. 3A to 3C, an upper electrode is formed in a predetermined area of the contact layer 15, and a lower electrode is formed on a rear surface of the semiconductor substrate 11.

The semiconductor laser light source according to the first embodiment includes a laser part 31 and a spot-size converter 32. In the laser part 31 of the semiconductor laser light source, the core area 13a of the waveguide layer 13 is formed to have a constant width W1. In the spot-size converter 32 of includes the semiconductor laser light source, the core area 13a of the waveguide layer 13 is gradually narrowed from a part having the constant width W1 in contact with the laser part 31 toward the other end to have a width W2. Note that a first end 10a on the laser part 31 side of the semiconductor laser light source includes a high reflection film, and a second end 10b on the spot-size converter 32 of the semiconductor laser light source includes a partial reflection film. The laser light is thus emitted from the second end 10b on the spot-size converter 32 side of the semiconductor laser light source according to the first embodiment.

The semiconductor laser light source according to the first embodiment is configured to emit the laser light obtained by enlarging the laser light having a spot 40a in the laser part 31 to a spot size of a spot 40b in the spot-size converter 32. Note that the core area 13a of the thin and long waveguide layer 13 serving as an optical waveguide may also be referred to as a "stripe" in the description of the semiconductor laser light source according to the first embodiment.

Next, an illustration is given of the enlargement of the spot size of the laser light in the spot-size converter 32. Specifically, a relationship between the width of the stripe (i.e., the core area 13a of the waveguide layer 13) and the spot size of the laser light is simulated based on a model illustrated in FIG. 5A. The model illustrated in FIG. 5A includes a layer corresponding to the waveguide layer 13 being formed on an AlGaAs layer having a thickness 6500 nm serving as the lower cladding layer 12. The layer corresponding to the waveguide layer 13 includes an area formed of GaAs and having a thickness of 400 nm to serve as the core area 13a, and an area having a thickness of 50 nm to serve as the rib area 13b. A layer corresponding to the upper cladding layer 14 is formed on a layer corresponding to the waveguide layer 13. The layer corresponding to the upper cladding layer 14 is made of AlGaAs, and is formed on the core area 13a and the rib areas 13b. The thickness of the layer corresponding to the upper cladding layer 14 on the core area 13a is 2300 nm and the thickness of the layer corresponding to the upper cladding layer 14 on the rib areas 13b is 2650 nm.

The simulation has investigated a spot size range of the laser light in a case of the width of the stripe varying from 0.3 to 0.75 μm. Note that an Al composition ratio in AlGaAs, which serves as the lower cladding layer and the upper cladding layer 14, varies from 0.15, 0.20, 0.25, and 0.30. Table 1 indicates relationships between composition ratios and refractive indices in AlGaAs and the like forming the lower cladding layer 12 and the upper cladding layer 14.

TABLE 1

|  | REFRACTIVE INDEX |
|---|---|
| $Al_{0.10}Ga_{0.80}As$ | 3.375 |
| $Al_{0.15}Ga_{0.85}As$ | 3.35 |
| $Al_{0.20}Ga_{0.80}As$ | 3.326 |
| $Al_{0.25}Ga_{0.75}As$ | 3.3 |
| $Al_{0.30}Ga_{0.70}As$ | 3.276 |
| GaAs | 3.425 |

Figures 5A, 5B:
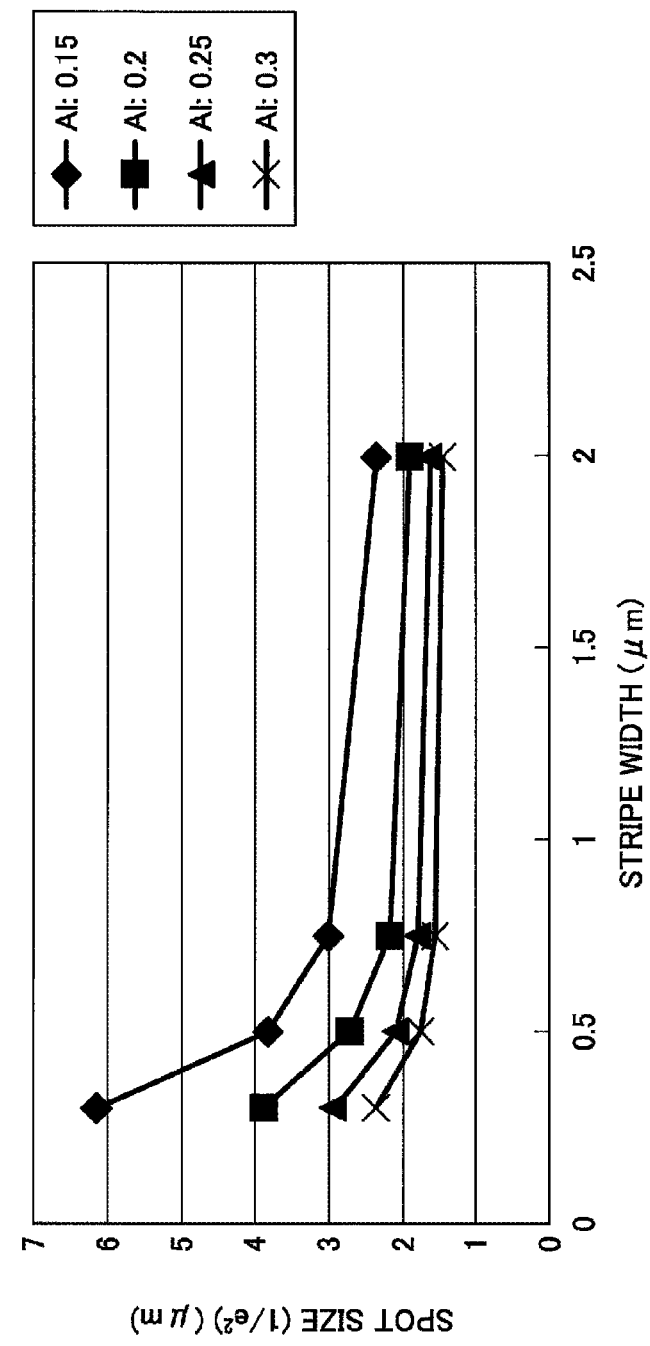
FIGS. 5A and 5B are diagrams illustrating simulation of the semiconductor laser light source according to the first embodiment.

As illustrated in FIG. 5B, the spot size may be enlarged by narrowing the width of the stripe. The following considers an example of obtaining the spot size of 3 μm using the spot-size converter 32 when the width W1 of the stripe (the width of the core area 13a) in the laser part 31 is 2 μm. In order to make the spot size to be 3 μm, the width W2 of the stripe (the width of the core area 13a) on the second end 10b needs to be 0.75 μm in an example of the Al composition ratio in AlGaAs being 0.15. Similarly, the width W2 of the stripe (the width of the core area 13a) on the second end 10b needs to be approximately 0.5 μm in an example of the Al composition ratio in AlGaAs being 0.20. The width W2 of the stripe (the width of the core area 13a) on the second end 10b needs to be approximately 0.3 µm in an example of the Al composition ratio in AlGaAs being 0.25.

The preferable Al composition ratio in AlGaAs corresponding to the lower cladding layer 12 and the upper cladding layer 14 may be 0.25 or lower, and may specifically be 0.20 or lower.

Fabrication Method of Semiconductor Laser Light Source

The following illustrates a fabrication method of the semiconductor laser light source according to the first embodiment.

Figure 6A:
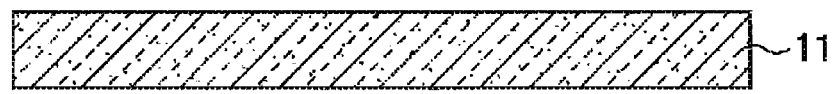
FIGS. 6A to 6C are first process drawings illustrating a fabrication method of the semiconductor laser light source according to the first embodiment.

As illustrated in FIG. 6A, a semiconductor substrate 11 made of a p-type GaAs substrate is initially prepared.

Figure 6B:
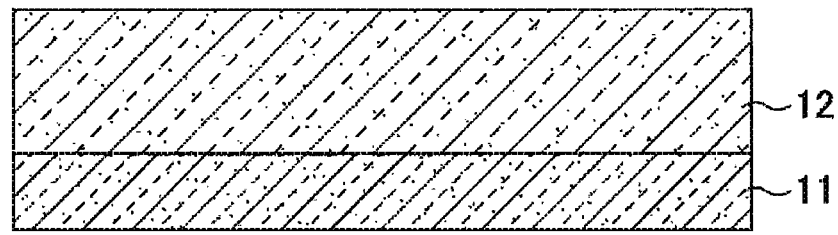

As illustrated in FIG. 6B, a not-illustrated buffer layer and a lower cladding layer 12 each made of a p-type AlGaAs are then epitaxially grown by molecular beam epitaxy (MBE) over the semiconductor substrate 11. A thickness of the not-illustrated buffer layer is 300 nm, and the buffer layer is doped with Be as a p-type dopant element at a concentration of $2\times10^{18}$ cm$^{-3}$. The lower cladding layer 12 is made of p-type $Al_{0.15}Ga_{0.85}As$ having a thickness of 2500 nm. The lower cladding layer 12 is doped with Be as a p-type dopant element at a concentration of $5\times10^{17}$ cm$^{-3}$.

Figure 6C:

As illustrated in FIG. 6C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, an InAs/GaAs quantum dot active layer 20 having a thickness of 320 nm, and an upper GaAs layer having a thickness of 30 nm on the lower cladding layer 12. Note that the InAs/GaAs quantum dot active layer 20 is made by forming eight quantum dot layers with 40 nm period. Further, a central part of the GaAs layer having 10 nm that is formed in each of intervals between the eight quantum dot layers is doped with Be as a p-type dopant element at a concentration of $5\times10^{17}$ cm$^{-3}$.

Figure 7A:
FIGS. 7A to 7C are second process drawings illustrating the fabrication method of the semiconductor laser light source according to the first embodiment.

Next, as illustrated in FIG. 7A, a hard mask 71 is formed corresponding to a shape of the stripe that is the core area 13a to serve as an optical waveguide. Specifically, a SiO$_2$ film is deposited on the waveguide forming film 13t by CVD in order to form the hard mask 71 on the waveguide forming film 13t. A photoresist is applied to the SiO$_2$ film, and the photoresist applied SiO$_2$ film is exposed and developed by an exposure system to form a not-illustrated resist pattern in an area in which the hard mask 71 is to be formed. The SiO$_2$ film in other areas having no resist pattern formed is subsequently removed by etching. The not-illustrated resist pattern is thereafter removed by an organic solvent or the like. The thus formed hard mask 71 is formed in an area corresponding to the core area 13a of the waveguide layer 13. Note that the hard mask 71 may be formed of SiON, SiN, or the like other than SiO$_2$.

Figure 7B:
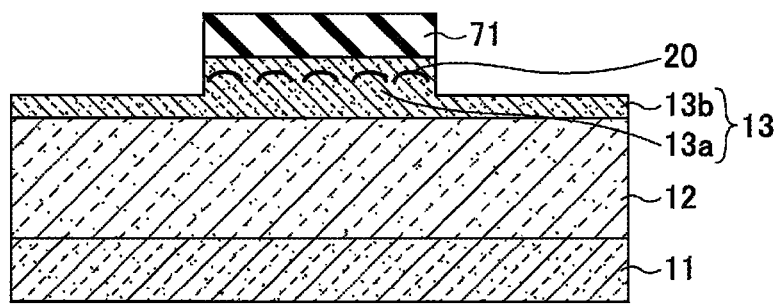

Next, the waveguide forming film 13t in the area in which no hard mask 71 is formed is removed by dry etching until the thickness of the waveguide forming film 13t reaches 50 nm, as illustrated in FIG. 7B. The InAs/GaAs quantum dot active layer 20 is removed from the areas in which no hard mask 71 is formed so as to obtain the rib areas 13b. Note that the waveguide forming film 13t remains in the area in which the hard mask 71 is formed so as to obtain the core area 13a. The waveguide layer 13 having the core area 13a and the rib areas 13b is obtained as a result. Note that when the waveguide forming film 13t is removed from the area in which no hard mask 71 is formed by dry etching, it may be preferable to slightly remove the GaAs layer from the surface by wet etching for subsequent epitaxial growth of the upper cladding layer 14.

Figure 7C:
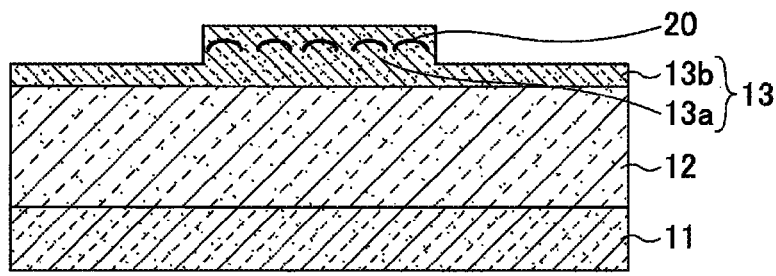

As illustrated in FIG. 7C, the hard mask 71 is subsequently removed by wet etching using a hydrofluoric acid or the like as etcher.

Figure 8A:
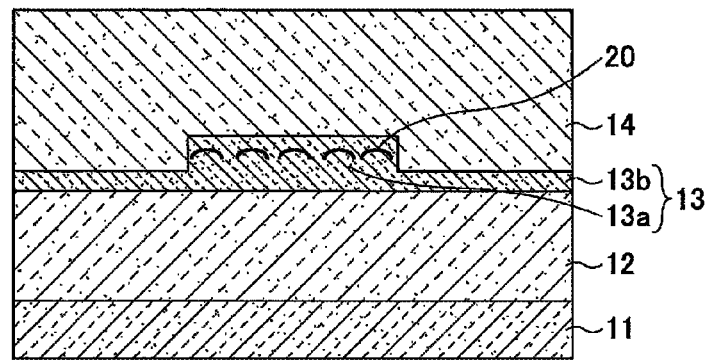
FIGS. 8A to 8C are third process drawings illustrating the fabrication method of the semiconductor laser light source according to the first embodiment.

As illustrated in FIG. 8A, the upper cladding layer 14 is then epitaxially grown on the core area 13a and the rib areas 13b of the waveguide layer 13. In the semiconductor laser light source according to the first embodiment, the upper cladding layer 14 is formed by metalorganic vapor phase epitaxy (MOVPE). The upper cladding layer 14 is formed by burying n-type $Al_{0.15}Ga_{0.85}As$ to grow to have a thickness of 2000 nm. The upper cladding layer 14 is doped with Si as an n-type dopant element at a concentration of $1\times10^{18}$ cm$^{-3}$.

Figure 8B:
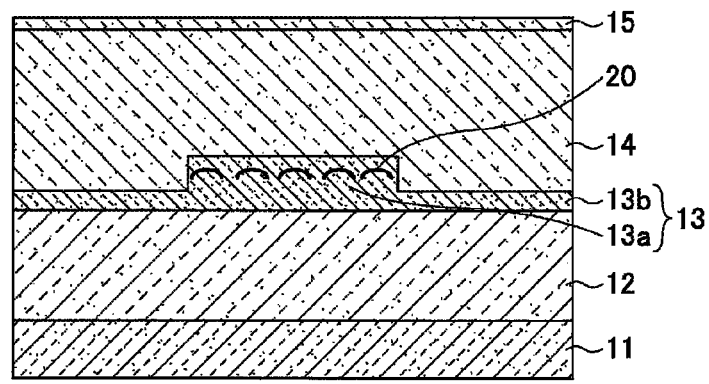

As illustrated in FIG. 8B, a contact layer 15 is epitaxially grown by MOVPE on the upper cladding layer 14. A thickness of the contact layer 15 is 300 nm, and the contact layer 15 is doped with Si as an n-type dopant element at a concentration of $2\times10^{18}$ cm$^{-3}$.

Figure 8C:
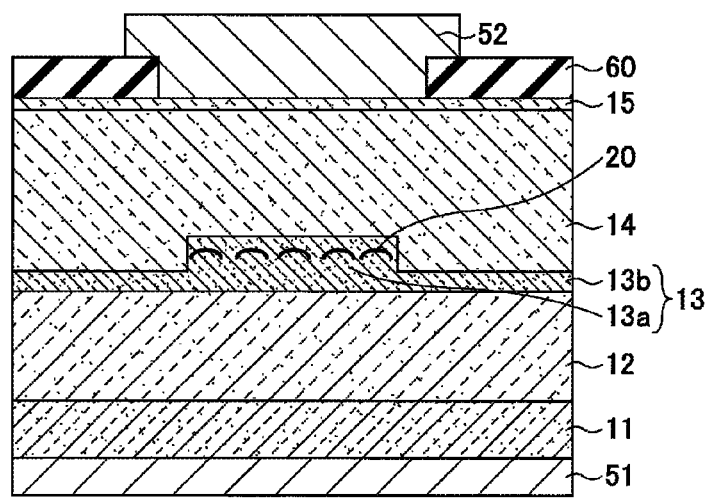

Next, as illustrated in FIG. 8C, an upper electrode 52 is formed in a predetermined area of a surface of the contact layer 15, and a lower electrode 51 is formed on a rear surface of the semiconductor substrate 11. Specifically, the lower electrode 51 is formed by depositing Au/Zn/Au on the rear surface of the semiconductor substrate 11 by vacuum evaporation or sputtering. Further, a SiN film for forming a protective film 60 is deposited on the contact layer 15, and an opening having a shape corresponding to the shape of the stripe is subsequently formed in the SiN film, thereby forming the protective film 60. The contact layer 15 is exposed via the opening in the protective film 60, and a AuGe/Au film is subsequently deposited in the predetermined area by vacuum evaporation or the like, thereby forming the upper electrode 52.

By allowing the rib areas 13b to remain at the time of forming the stripe by etching as described above, the AlGaAs layer is not exposed from the surface of the quantum dot active layer formed into the stripe. The upper cladding layer may thus be regrown without being affected by oxidation of AlGaAs.

Note that in the first embodiment, the n-type and p-type may be reversed.

SECOND EMBODIMENT

Semiconductor Laser Light Source

Figure 9A:
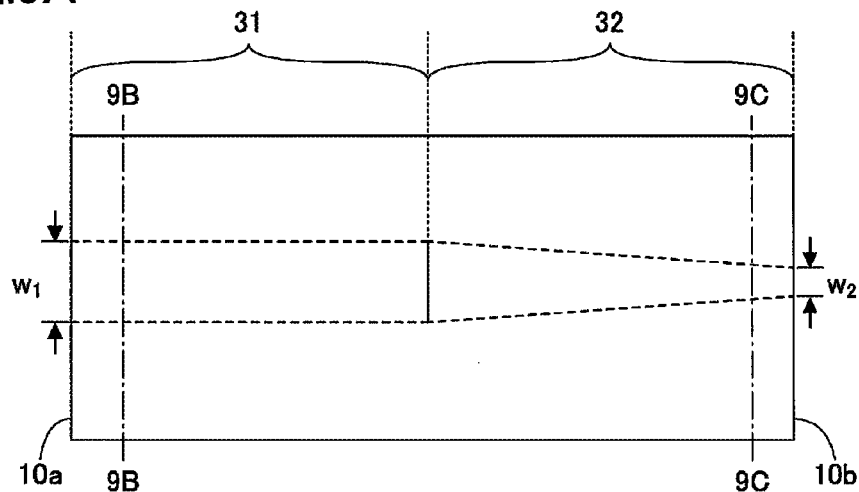
FIGS. 9A to 9C are diagrams illustrating a semiconductor laser light source according to a second embodiment.
Figure 9B:
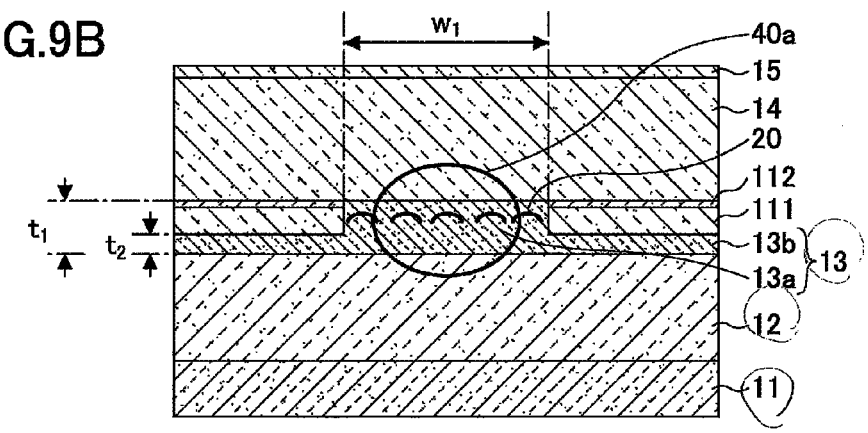
Figure 9C:
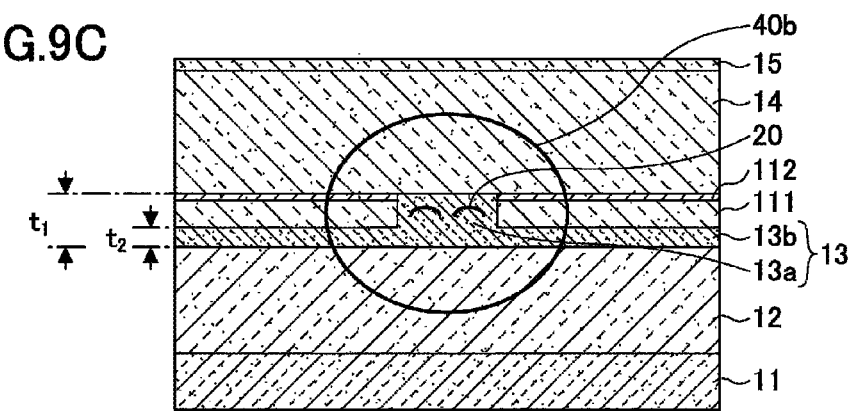

Next, a description is given of a semiconductor laser light source according to a second embodiment with reference to FIGS. 9A to 9C. FIG. 9A is a top view of the semiconductor laser light source according to the second embodiment. FIG. 9B is a sectional view cut along a dash-dot line 9B-9B of FIG. 9A, and FIG. 9C is a sectional view cut along a dash-dot line 9C-9C of FIG. 9A.

As illustrated in FIGS. 9A to 9C, the semiconductor laser light source according to the second embodiment includes the lower cladding layer 12 and the waveguide layer 13 formed over the semiconductor substrate 11. The waveguide layer 13 includes a core area 13a through which light is guided and rib areas 13b on either side of the core area 13a. An intermediate cladding layer 111 and a block layer 112 are formed on the rib areas 13b. The upper cladding layer 14 and the contact layer 15 are formed in layers in this order on the core area 13a and on the block layer 112 on the rib areas 13b.

The semiconductor substrate 11 is formed of an n-type GaAs substrate, and the lower cladding layer 12 is formed of n-type AlGaAs. In the waveguide layer 13, an InAs/GaAs quantum dot active layer 20 informed on the core area 13a but the InAs/GaAs quantum dot active layer 20 is not formed on the rib areas 13b. Hence, in the waveguide layer 13, a thickness t1 of the core area 13a is greater than a thickness $t_2$ of the rib areas 13b.

The upper cladding layer 14 is formed of p-type AlGaAs, and the contact layer 15 is formed of p-type GaAs. The intermediate cladding layer 111 is formed of p-type AlGaAs, and the block layer 112 is formed of n-type GaAs. In the semiconductor laser light source according to the second embodiment, the n-type GaAs of the block layer 112 and the p-type AlGaAs of the upper cladding layer 14 form a pn junction to obtain a current confinement structure. The formation of the current confinement structure allows little electric current to flow into the rib areas 13b of the waveguide layer 13 but dominantly allows electric current to flow into the core area 13a of the waveguide layer 13, thereby lowering the drive current flow. Note that though not illustrated in FIGS. 9A to 9C, an upper electrode is formed in a predetermined area of the contact layer 15, and a lower electrode is formed on a rear surface of the semiconductor substrate 11.

The following illustrates a spot size of the light emitted by the semiconductor laser light source according to the second embodiment. Specifically, a relationship between the spot size of laser light and the thickness of the block layer 112 is simulated, based on a model illustrated in FIG. 10A. The model illustrated in FIG. 10A includes a layer corresponding to the waveguide layer 13 being formed on an AlGaAs layer having a thickness of 6500 nm serving as the lower cladding layer 12. The layer corresponding to the waveguide layer 13 includes an area made of GaAs with a thickness of 400 nm corresponding to the core area 13a, and areas made of made of GaAs with a thickness of 50 nm corresponding to the rib areas 13b.

A layer corresponding to the intermediate cladding layer 111 and a layer corresponding to the block layer 112 are formed in layers in the areas serving as the rib areas 13b. The layer corresponding to the intermediate cladding layer 111 is formed of AlGaAs having a thickness range of 340 to 300 nm, and the layer corresponding to the block layer 112 is formed of GaAs having a thickness range of 10 to 50 nm. The sum of the thickness of the layer corresponding to the intermediate cladding layer 111 and the thickness of the layer corresponding to the block layer 112 is 350 nm.

A layer corresponding to the upper cladding layer 14 is formed over the area corresponding to the core area 13a and is also formed on the layer corresponding to the block layer 112 over the areas corresponding to the rib areas 13b. The layer corresponding to the upper cladding layer 14 is formed of AlGaAs having a thickness of 2300 nm.

The simulation has examined the spot size obtained in accordance with the thickness of the layer corresponding to the block layer 112 being changed from 10 to 50 nm. Note that the Al composition ratio and the stripe width (the width of the core area 13a) in AlGaAs corresponding to the lower cladding layer 12 and the upper cladding layer 14 are changed.

Figures 10A, 10B:
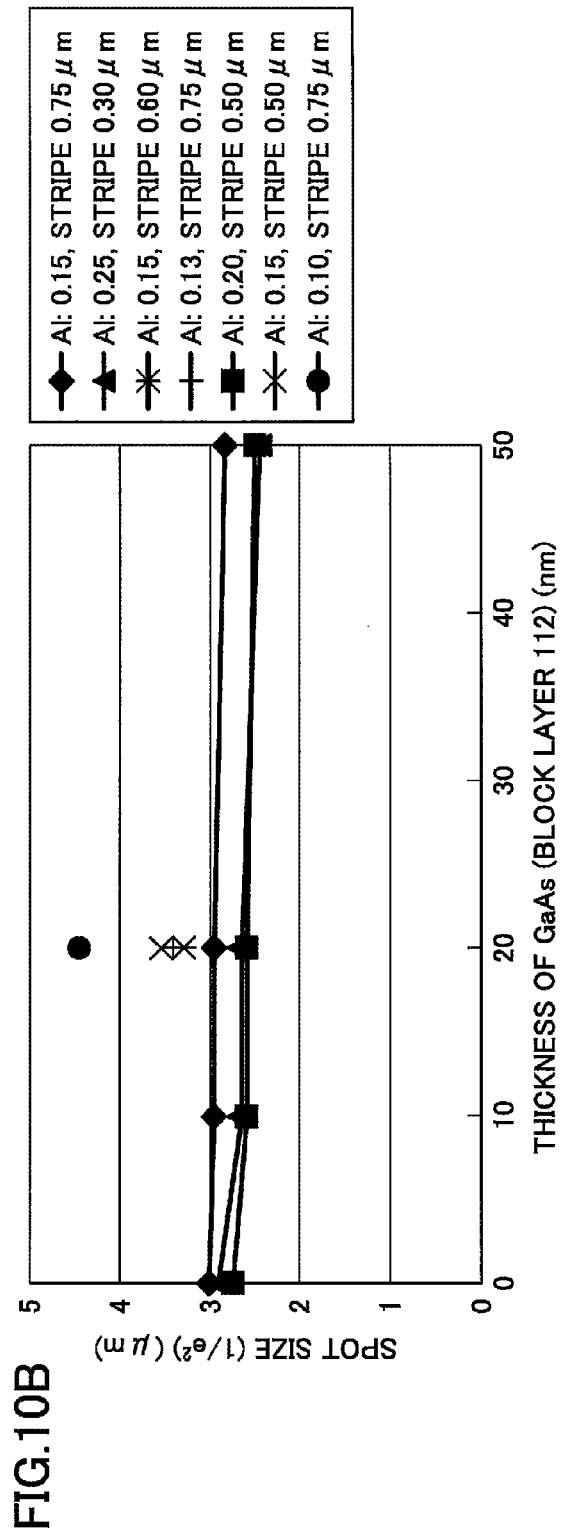
FIGS. 10A and 10B are diagrams illustrating simulation of the semiconductor laser light source according to the second embodiment.

As illustrated in FIG. 10B, the spot size slightly enlarges with the reduction in the thickness of the layer corresponding to the block layer 112; however, little change is observed in the spot size. Thus, the spot size will not be affected by disposing the block layer 112.

Fabrication Method of Semiconductor Laser Light Source

The following illustrates a fabrication method of the semiconductor laser light source according to the second embodiment.

Figure 11A:
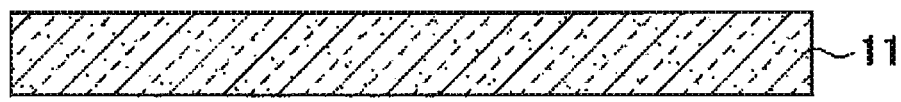
FIGS. 11A to 11C are first process drawings illustrating a fabrication method of the semiconductor laser light source according to the second embodiment.

As illustrated in FIG. 11A, a semiconductor substrate 11 formed of an n-type GaAs substrate is initially prepared.

Figure 11B:
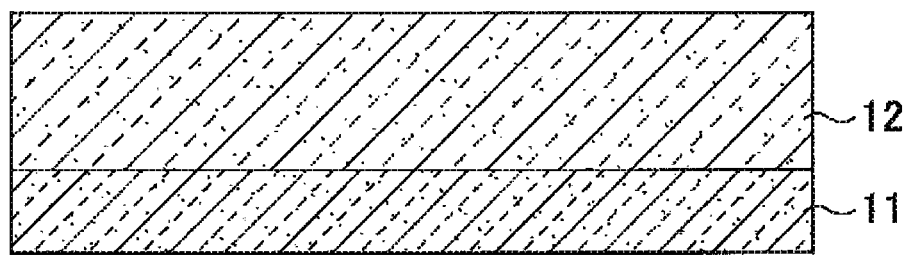

As illustrated in FIG. 11B, a not-illustrated buffer layer and a lower cladding layer 12 each made of an n-type AlGaAs are then epitaxially grown by MBE over the semiconductor substrate 11. A thickness of the not-illustrated buffer layer is 300 nm, and the buffer layer is doped with Si as an n-type dopant element at a concentration of $2 \times 10^{18}$ $cm^{-3}$. The lower cladding layer 12 is made of n-type $Al_{0.15}Ga_{0.85}As$ having a thickness of 2500 nm. The lower cladding layer 12 is doped with Si as an n-type dopant element at a concentration of $5 \times 10^{17}$ $cm^{-3}$.

Figure 11C:
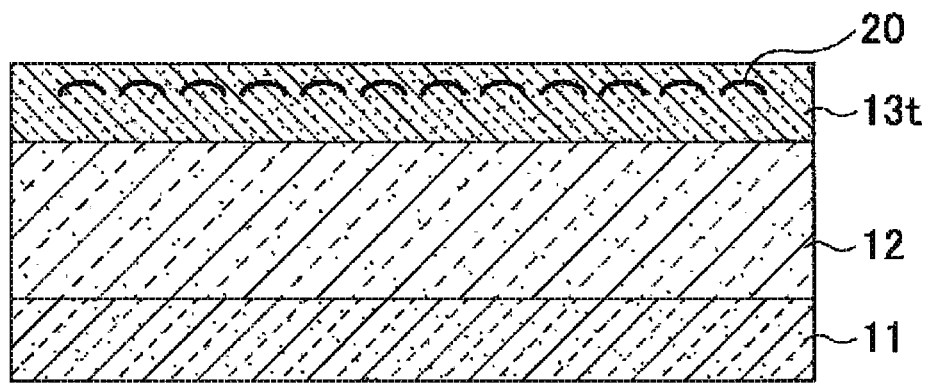

As illustrated in FIG. 11C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, an InAs/GaAs quantum dot active layer 20 having a thickness of 320 nm, and an upper GaAs layer having a thickness of 30 nm on the lower cladding layer 12. Note that the InAs/GaAs quantum dot active layer 20 is obtained by forming eight quantum dot layers with 40 nm period. Further, a central part having 10 nm of the GaAs layer formed in each of intervals between the eight quantum dot layers is doped with Be as a p-type dopant element at a concentration of $5 \times 10^{17}$ $cm^{-3}$.

Figure 12A:
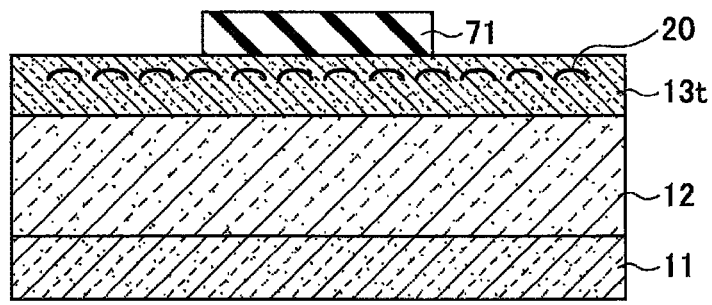
FIGS. 12A to 12C are second process drawings illustrating the fabrication method of the semiconductor laser light source according to the second embodiment.

Next, as illustrated in FIG. 12A, a hard mask 71 is formed corresponding to a shape of the stripe that is the core area 13a to serve as an optical waveguide. Specifically, a $SiO_2$ film is deposited on the waveguide forming film 13t by CVD in order to form the hard mask 71 on the waveguide forming film 13t. A photoresist is applied to the $SiO_2$ film, and the photoresist applied $SiO_2$ film is exposed and developed by an exposure system to form a not-illustrated resist pattern in an area in which the hard mask 71 is formed. The $SiO_2$ film in other areas having no resist pattern formed is subsequently removed by etching. The not-illustrated resist pattern is thereafter removed by an organic solvent or the like. The thus formed hard mask 71 is formed in an area corresponding to the core area 13a of the waveguide layer 13. Note that the hard mask 71 may be formed of SiON, SiN, or the like other than $SiO_2$.

Figure 12B:
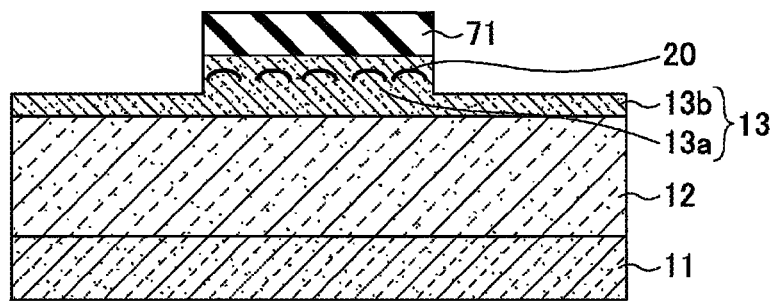

Next, the waveguide forming film 13t in the area in which no hard mask 71 is formed is removed by dry etching until the thickness of the waveguide forming film 13t reaches 50 nm, as illustrated in FIG. 12B, The InAs/GaAs quantum dot active layer 20 is removed from the areas in which no hard mask 71 is formed so as to obtain the rib areas 13b. Note that the waveguide forming film 13t remains in the area in which the hard mask 71 is formed so as to form the core area 13a. The waveguide layer 13 having the core area 13a and the rib areas 13b is obtained as a result.

Figure 12C:
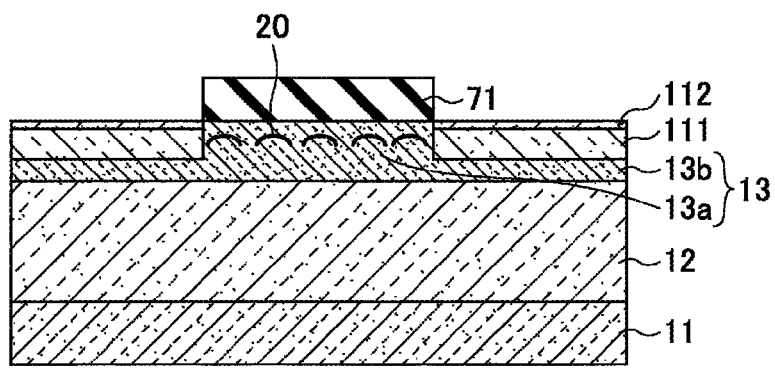

Next, as illustrated in FIG. 12C, p-type AlGaAs serving as the intermediate cladding layer 111 and n-type GaAs serving as the block layer 112 are epitaxial grown in layers by MOVPE over the rib areas 13b of the waveguide layer 13. The intermediate cladding layer 111 is made of p-type $Al_{0.15}Ga_{0.85}As$ having a thickness of approximately 330 nm. The intermediate cladding layer 111 is doped with Zn as a p-type dopant element at a concentration of $5\times10^{17}$ cm$^{-3}$. The block layer 112 is made of n-type GaAs having a thickness of 20 nm. The block layer 112 is doped with Si as an n-type dopant element at a concentration of $2\times10^{18}$ cm$^{-3}$. Note that the intermediate cladding layer 111 and the block layer 112 are formed by epitaxial growth. Accordingly, the intermediate cladding layer 111 and the block layer 112 will not be grown on the hard mask 71 having an amorphous crystal structure but are formed only on the rib areas 13b from which the compound semiconductor is exposed.

Figure 13A:
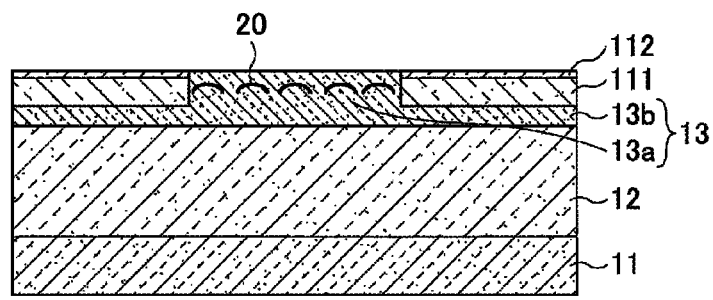
FIGS. 13A to 13C are third process drawings illustrating the fabrication method of the semiconductor laser light source according to the second embodiment.

As illustrated in FIG. 13A, the hard mask 71 is subsequently removed by wet etching using a hydrofluoric acid or the like as etcher.

Figure 13B:
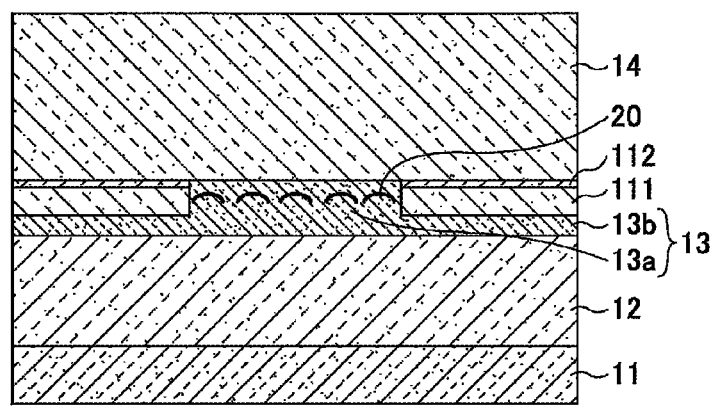

As illustrated in FIG. 13B, the upper cladding layer 14 is then epitaxially grown by MOVPE on the core area 13a and on the block layer 112 on the rib areas 13b of the waveguide layer 13. The upper cladding layer 14 is made of p-type $Al_{0.15}Ga_{0.85}As$ having a thickness of approximately 2000 nm. The upper cladding layer 14 is doped with Zn as a p-type dopant element at a concentration of $1\times10^{18}$ cm$^{-3}$.

Figure 13C:
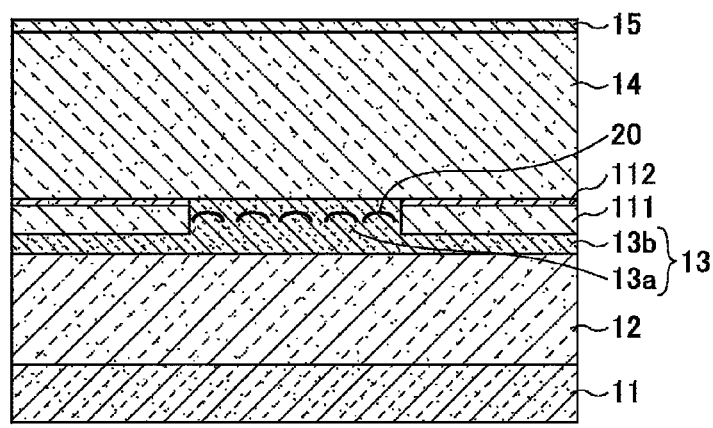

As illustrated in FIG. 13C, the contact layer 15 is formed by MOVPE on the upper cladding layer 14. A thickness of the contact layer 15 is 300 nm, and the contact layer 15 is doped with Zn as a p-type dopant element at a concentration of $1\times10^{19}$ cm$^{-3}$.

Figure 14:
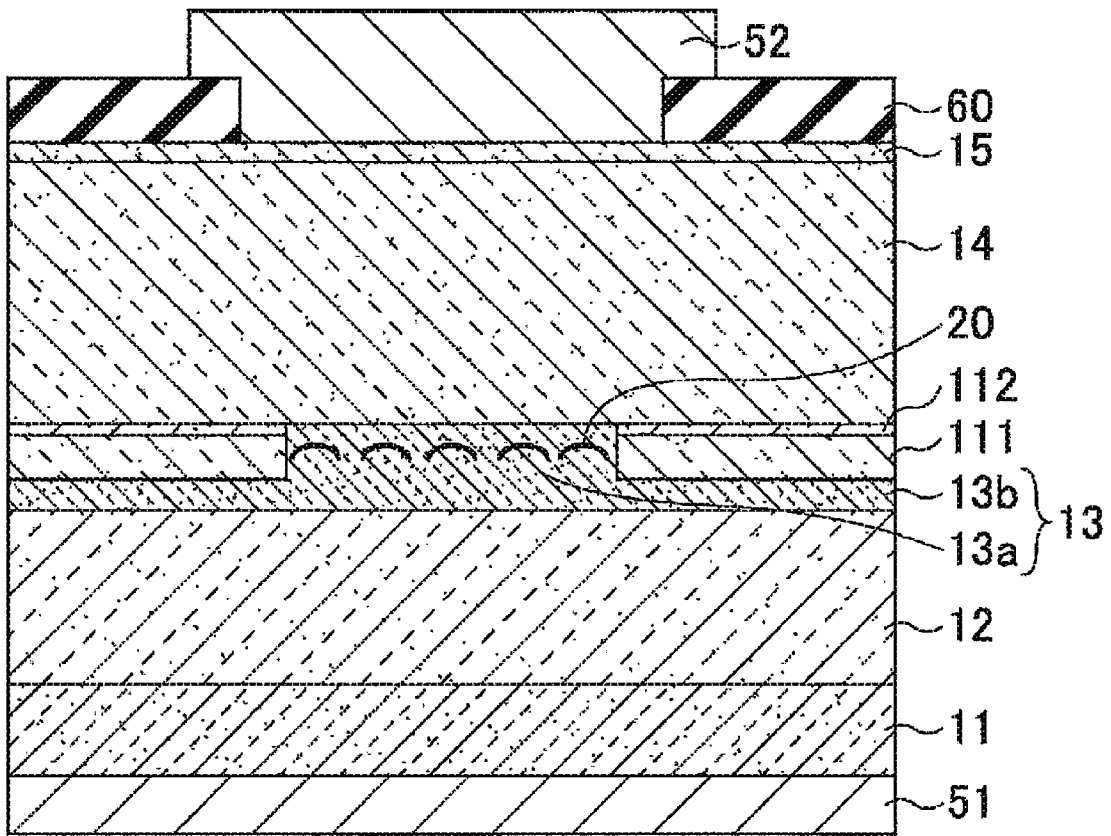
FIG. 14 is a fourth process drawing illustrating the fabrication method of the semiconductor laser light source according to the second embodiment.

Next, as illustrated in FIG. 14, an upper electrode 52 is formed in a predetermined area of a surface of the contact layer 15, and a lower electrode 51 is formed on a rear surface of the semiconductor substrate 11. Specifically, the lower electrode 51 is formed by depositing AuGe/Au on the rear surface of the semiconductor substrate 11 by vacuum evaporation or sputtering. Further, a SiN film for forming a protective film 60 is deposited on the contact layer 15, and an opening having a shape corresponding to the shape of a stripe is subsequently formed in the SiN film, thereby forming the protective film 60. The contact layer 15 is exposed via the opening in the protective film 60, and a Au/Zn/Au film is subsequently deposited in the predetermined area by vacuum evaporation or the like, thereby forming the upper electrode 52.

By allowing the rib areas 13b to remain at the time of forming the stripe by etching as described above, the AlGaAs layer is not exposed from the surface of the quantum dot active layer formed into the stripe. The intermediate cladding layer 111 and the block layer 112 may thus be regrown without being affected by oxidation of AlGaAs. Further, since the block layer 112 is made of GaAs, all the layers appearing as a surface after the growth of the block layer 112 are GaAs. The upper cladding layer 14 may thus be regrown without being affected by oxidation of AlGaAs.

Note that in the second embodiment, the n-type and p-type may be reversed; however, the effect of the current block layer, which is disposed on the n-type substrate in the second embodiment, is superior to the current block layer, which is disposed on the p-type substrate. Note that the illustration of the fabrication method of the semiconductor laser light source in the second embodiment other than those described above may be similar to the illustration of the fabrication method in the first embodiment.

THIRD EMBODIMENT

Semiconductor Laser Light Source

Figure 15A:
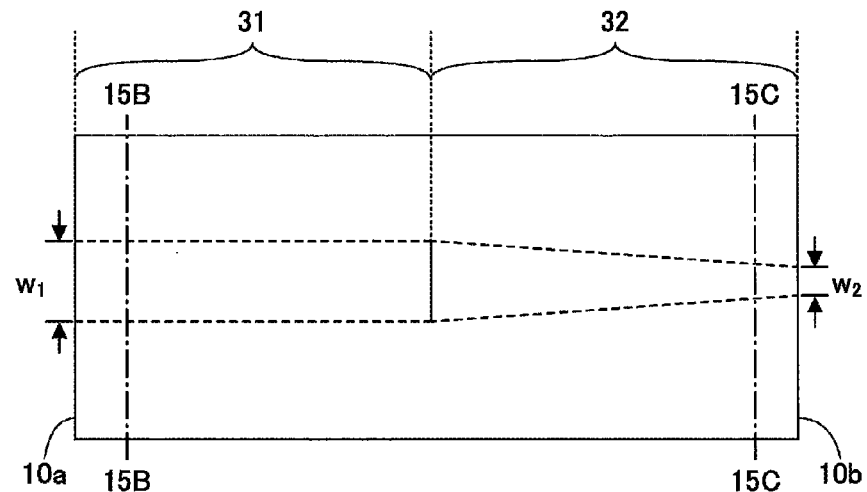
FIGS. 15A to 15C are diagrams illustrating a semiconductor laser light source according to a third embodiment.
Figure 15B:
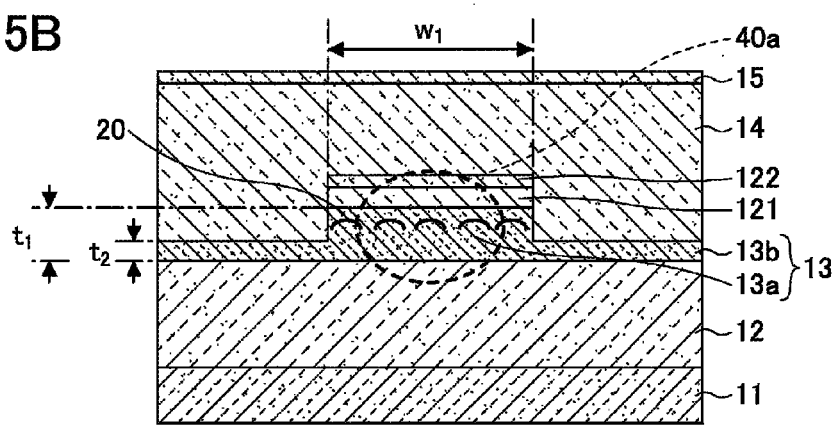
Figure 15C:
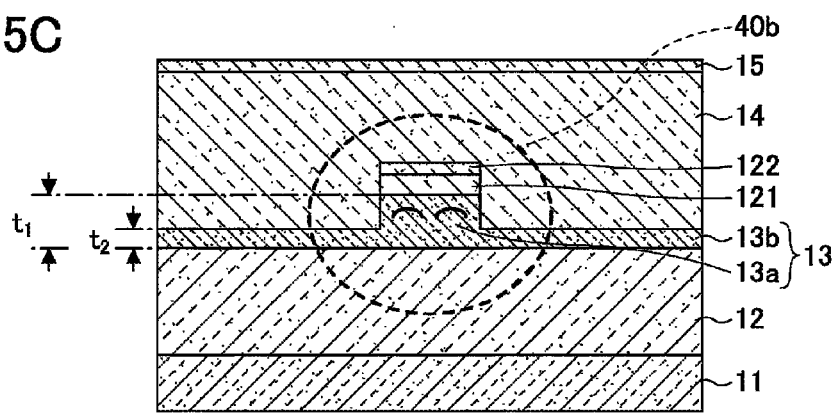

Next, a description is given of a semiconductor laser light source according to a third embodiment with reference to FIGS. 15A to 15C. FIG. 15A is a top view of the semiconductor laser light source according to the third embodiment. FIG. 15B is a sectional view cut along cut along a dash-dot line 15B-15B of FIG. 15A, and FIG. 15C is a sectional view cut along a dash-dot line 15C-15C of FIG. 15A.

As illustrated in FIGS. 15A to 15C, the semiconductor laser light source according to the third embodiment includes the lower cladding layer 12 and the waveguide layer 13 formed over the semiconductor substrate 11. The waveguide layer 13 includes a core area 13a through which light is guided and rib areas 13b on either side of the core area 13a. A spacer layer 121 and a cap layer 122 are formed on the core area 13a. The upper cladding layer 14 and the contact layer 15 are formed in layers in this order on the cap layer 122 on the core area 13a and on the rib areas 13b.

The semiconductor substrate 11 is formed of a p-type GaAs substrate, and the lower cladding layer 12 is formed of p-type AlGaAs. In the waveguide layer 13, an InAs/GaAs quantum dot active layer 20 is formed on the core area 13a but the InAs/GaAs quantum dot active layer 20 is not formed on the rib areas 13b. Hence, in the waveguide layer 13, a thickness $t_1$ of the core area 13a is greater than a thickness $t_2$ of the rib areas 13b.

The upper cladding layer 14 is formed of n-type AlGaAs, and the contact layer 15 is formed of n-type GaAs. The spacer layer 121 is formed of n-type AlGaAs, and the cap layer 122 is formed of n-type GaAs. In the semiconductor laser light source according to the third embodiment, the core area 13a is formed in the waveguide layer 13. This method may prevent the core area 13a from being damaged and prevent characteristics of the core area 13a from being degraded when the hard mask is formed on the core area 13a. Note that though not illustrated in FIGS. 15A to 15C, an upper electrode is formed in a predetermined area of the contact layer 15, and a lower electrode is formed on a rear surface of the semiconductor substrate 11.

The following illustrates a spot size of the light emitted by the semiconductor laser light source according to the third embodiment. Specifically, a relationship between the spot size of laser light and the thickness of the spacer layer 121 is simulated, based on the model illustrated in FIG. 16A. The model illustrated in FIG. 16A includes a layer corresponding to the waveguide layer 13 being formed on an AlGaAs layer having a thickness of 6500 nm corresponding to the lower cladding layer 12. The layer corresponding to the waveguide layer 13 includes an area made of GaAs with a thickness of 400 nm corresponding to the core area 13a, and areas made of GaAs with a thickness of 50 nm corresponding to the rib areas 13b.

A layer corresponding to the spacer layer 121 and a layer corresponding to the cap layer 122 are formed in layers in the area serving as the core area 13a. The layer corresponding to the spacer layer 121 is formed of AlGaAs having a thickness range of 50 to 500 nm, and the layer corresponding to the cap layer 122 is formed of GaAs having a thickness of 20 nm.

A layer corresponding to the upper cladding layer 14 is formed on the layer corresponding to the cap layer 122 on the core area 13a and is also formed in the areas corresponding to the rib areas 13b. The layer corresponding to the upper cladding layer 14 is made of AlGaAs, and is formed on the layer corresponding to the cap layer 122 and the rib areas 13b. The thickness of the layer corresponding to the upper cladding layer 14 on the cap layer 122 is 2300 nm and the thickness of the layer corresponding to the upper cladding layer 14 on the rib areas 13b is in a range of 2750 to 3200 nm.

The simulation has examined the spot size obtained in accordance with the thickness of the layer corresponding to the spacer layer 121 being changed from 50 to 500 nm. Note that the Al composition ratio and the stripe width (the width of the core area 13a) in AlGaAs corresponding to the lower cladding layer 12 and the upper cladding layer 14 are changed.

Figures 16A, 16B:
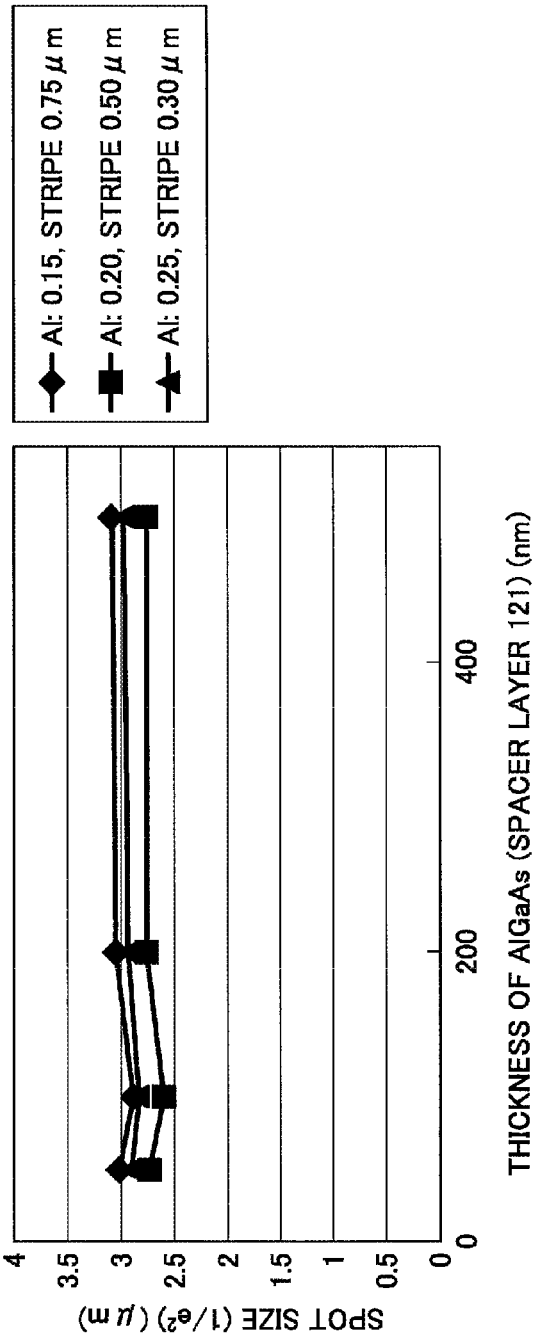
FIGS. 16A and 16B are diagrams illustrating simulation of the semiconductor laser light source according to the third embodiment.

As illustrated in FIG. 16B, little change has been detected by changing the thickness of the layer corresponding to the spacer layer 121.

Fabrication Method of Semiconductor Laser Light Source

The following illustrates a fabrication method of the semiconductor laser light source according to the third embodiment.

Figure 17A:
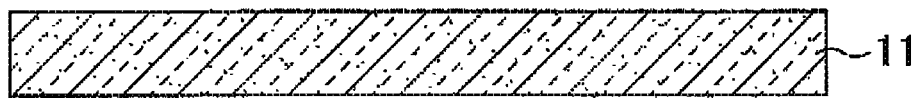
FIGS. 17A to 17C are first process drawings illustrating a fabrication method of the semiconductor laser light source according to the third embodiment.
Figure 17B:
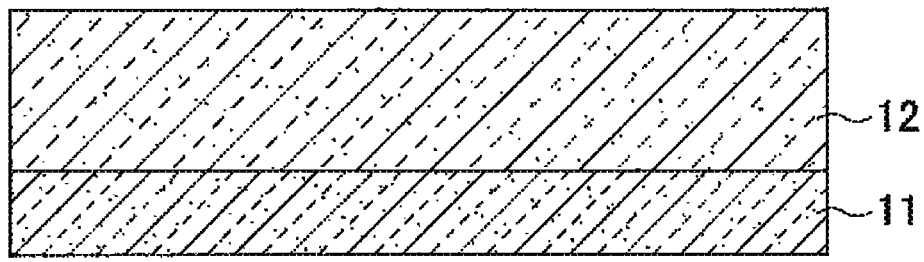

As illustrated in FIG. 17A, a semiconductor substrate 11 made of a p-type GaAs substrate is initially prepared.

As illustrated in FIG. 11B, a not-illustrated buffer layer and a lower cladding layer 12 each made of a p-type AlGaAs are then epitaxially grown by MBE over the semiconductor substrate 11. A thickness of the not-illustrated buffer layer is 300 nm, and the buffer layer is doped with Be as a p-type dopant element at a concentration of $2 \times 10^{18}$ cm$^{-3}$. The lower cladding layer 12 is made of p-type $Al_{0.15}Ga_{0.85}As$ having a thickness of 2500 nm. The lower cladding layer 12 is doped with Be as a p-type dopant element at a concentration of $5 \times 10^{17}$ cm$^{-3}$.

Figure 17C:
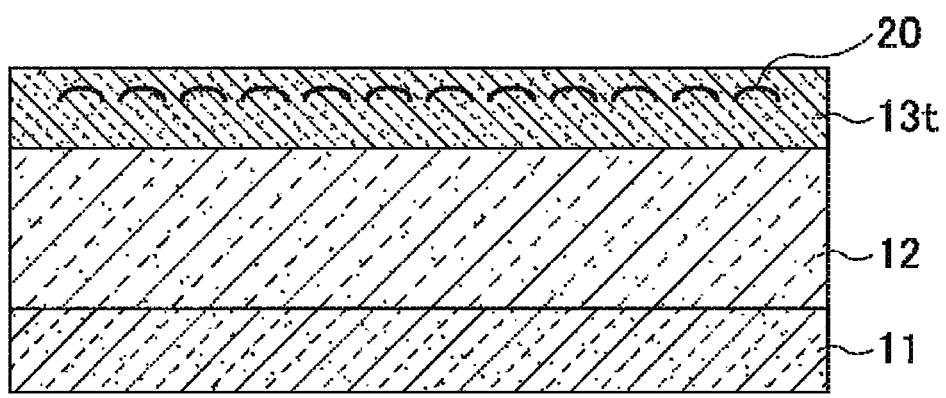

As illustrated in FIG. 17C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, an InAs/GaAs quantum dot active layer 20 having a thickness of 320 nm, and an upper GaAs layer having a thickness of 30 nm on the lower cladding layer 12. Note that the InAs/GaAs quantum dot active layer 20 is made by forming eight quantum dot layers with 40 nm period. Further, a central part of the GaAs layer having 10 nm that is formed in each of intervals between the eight quantum dot layers is doped with Be as a p-type dopant element at a concentration of $5 \times 10^{17}$ cm$^{-3}$.

Figure 18A:
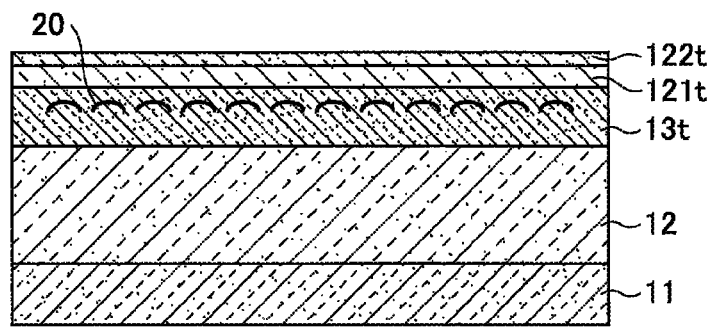
FIGS. 18A to 18C are second process drawings illustrating the fabrication method of the semiconductor laser light source according to the third embodiment.

Next, as illustrated in FIG. 18A, an n-type AlGaAs film 121t for forming a spacer layer 121 and an n-type GaAs film 122t for forming a cap layer 122 are epitaxially grown in layers by MBE on the waveguide forming film 13t. Note that in the semiconductor laser light source according to the third embodiment, the n-type AlGaAs film 121t may also be referred to as a spacer forming film and similarly, the n-type GaAs film 122t may also be referred to as a cap forming film. The n-type AlGaAs film 121t is made of n-type $Al_{0.15}Ga_{0.85}As$ having a thickness of approximately 200 nm. The n-type AlGaAs film 121t is doped with Si as an n-type dopant element at a concentration of $1 \times 10^{18}$ cm$^{-3}$. The n-type GaAs film 122t is made of n-type GaAs having a thickness of approximately 20 nm. The n-type GaAs film 122t is doped with Si as an n-type dopant element at a concentration of $1 \times 10^{18}$ cm$^{-3}$.

Figure 18B:
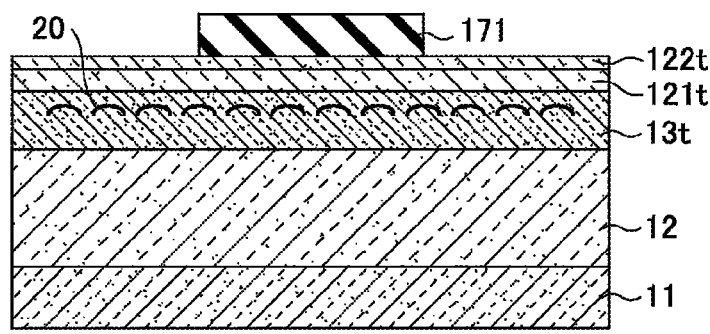

Next, as illustrated in FIG. 18B, a hard mask 171 is formed corresponding to a shape of the stripe that is the core area 13a to serve as an optical waveguide. Specifically, a SiO$_2$ film is deposited on the n-type GaAs film 122t by CVD in order to form the hard mask 171 on the n-type GaAs film 122t. A photoresist is applied to the SiO$_2$ film, and the photoresist applied SiO$_2$ film is exposed and developed by an exposure system to form a not-illustrated resist pattern in an area in which the hard mask 171 is formed. The SiO$_2$ film in other areas having no resist pattern formed is subsequently removed by etching. The not-illustrated resist pattern is thereafter removed by an organic solvent or the like. The hard mask 171 is thus formed in an area corresponding to the core area 13a of the waveguide layer 13. Note that the hard mask 171 may be formed of SiON, SiN, or the like other than SiO$_2$.

Figure 18C:
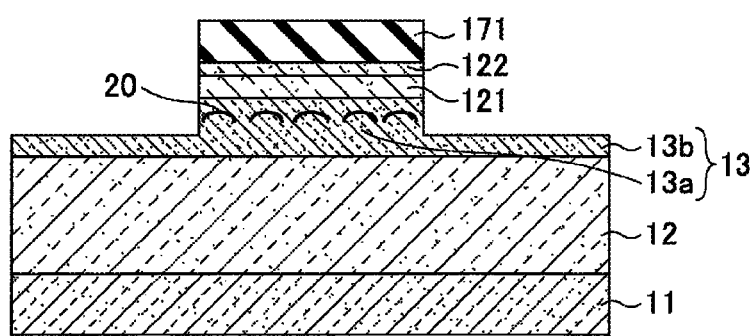

Next, as illustrated in FIG. 18C, the n-type GaAs film 122t and the n-type AlGaAs film 121t in the areas where no hard mask 171 is formed are removed by dry etching or the like, and the waveguide forming film 13t is subsequently removed until the thickness of the waveguide forming film 13t reaches 50 nm. The InAs/GaAs quantum dot active layer 20 is removed from the areas in which no hard mask 171 is formed so as to obtain the rib areas 13b. As a result, in the area in which the hard mask 171 is formed, the cap layer 122 is formed of the remaining n-type GaAs film 122t and the spacer layer 121 is formed of the remaining n-type AlGaAs film 121t. Further, the core area 13a having the InAs/GaAs quantum dot active layer 20 is formed of the remaining waveguide forming film 13t. The waveguide layer 13 having the core area 13a and the rib areas 13b is thus obtained.

Figure 19A:
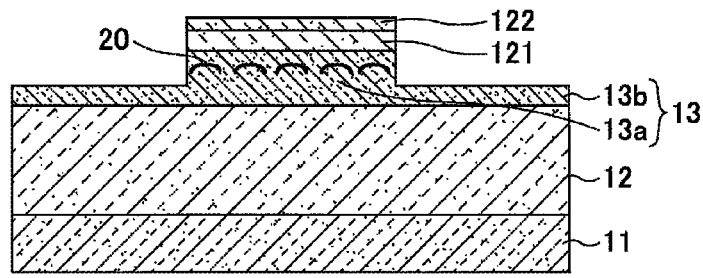
FIGS. 19A to 19C are third process drawings illustrating the fabrication method of the semiconductor laser light source according to the third embodiment.

As illustrated in FIG. 19A, the hard mask 171 is subsequently removed by wet etching using a hydrofluoric acid or the like as etcher.

Figure 19B:
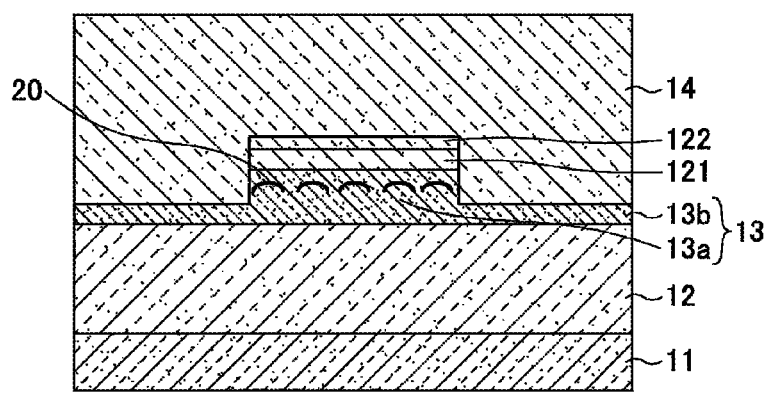

As illustrated in FIG. 19B, the upper cladding layer 14 is then epitaxially grown by MOVPE on the cap layer 122 on the core area 13a and on the rib areas 13b of the waveguide layer 13. The upper cladding layer 14 is formed by burying n-type $Al_{0.15}Ga_{0.85}As$ to grow to have a thickness of 2000 nm. The upper cladding layer 14 is doped with Si as an n-type dopant element at a concentration of $1 \times 10^{18}$ cm$^{-3}$.

Figure 19C:
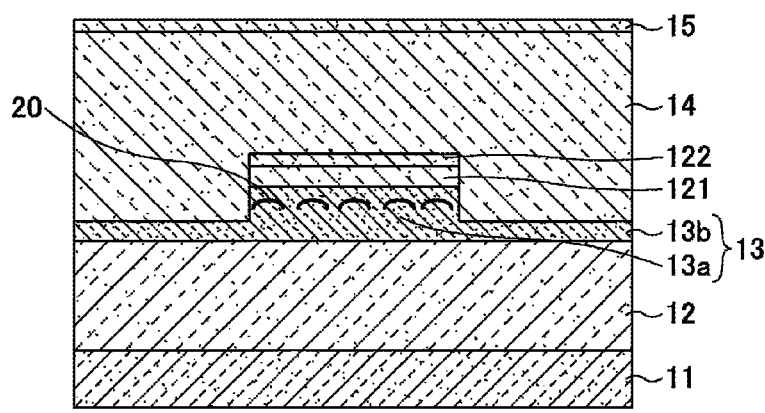

As illustrated in FIG. 19C, the contact layer 15 is formed by MOVPE on the upper cladding layer 14. A thickness of the contact layer 15 is 300 nm, and the contact layer 15 is doped with Si as an n-type dopant element at a concentration of $2 \times 10^{18}$ cm$^{-3}$.

Figure 20:
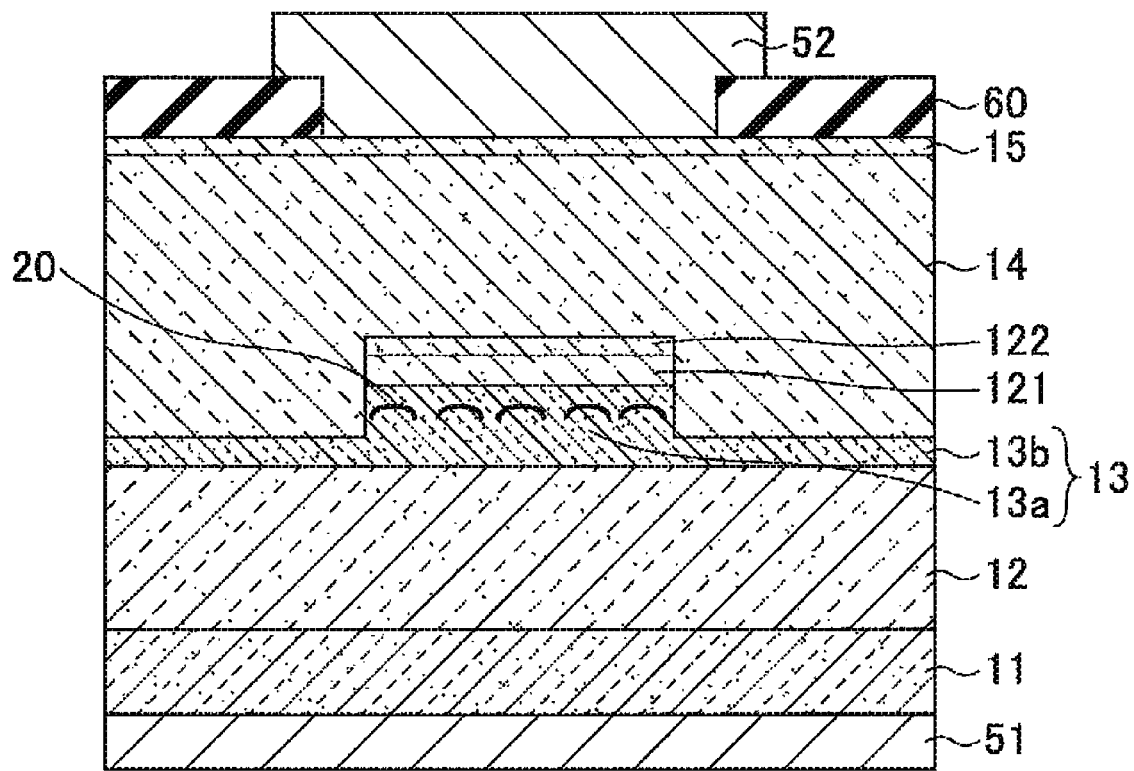
FIG. 20 is a fourth process drawing illustrating the fabrication method of the semiconductor laser light source according to the third embodiment.

Next, as illustrated in FIG. 20, an upper electrode 52 is formed in a predetermined area of a surface of the contact layer 15, and a lower electrode 51 is formed on a rear surface of the semiconductor substrate 11. Specifically, the lower electrode 51 is formed by depositing Au/Zn/Au on the rear surface of the semiconductor substrate 11 by vacuum evaporation or sputtering. Further, a SiN film for forming a protective film 60 is deposited on the contact layer 15, and an opening having a shape corresponding to the shape of the stripe is subsequently formed in the SiN film, thereby forming the protective film 60. The contact layer 15 is exposed via the opening in the protective film 60, and a AuGe/Au film is subsequently deposited in the predetermined area by vacuum evaporation or the like, thereby forming the upper electrode 52.

Compared to the first embodiment, the third embodiment may be able to control process induced damage on the quantum dot layer. Although a lateral side of the AlGaAs layer serving as the spacer layer is exposed as a surface of the stripe formed of a quantum dot active layer, the exposed side is only a limited area. Accordingly, the upper cladding layer 14 may be regrown with only limited effect of AlGaAs oxidation.

Note that in the third embodiment, the n-type and p-type may be reversed. Note that the illustration of the fabrication method of the semiconductor laser light source in the third embodiment other than those described above may be similar to the illustration of the fabrication method in the first embodiment.

FOURTH EMBODIMENT

Semiconductor Laser Light Source

Figure 21A:
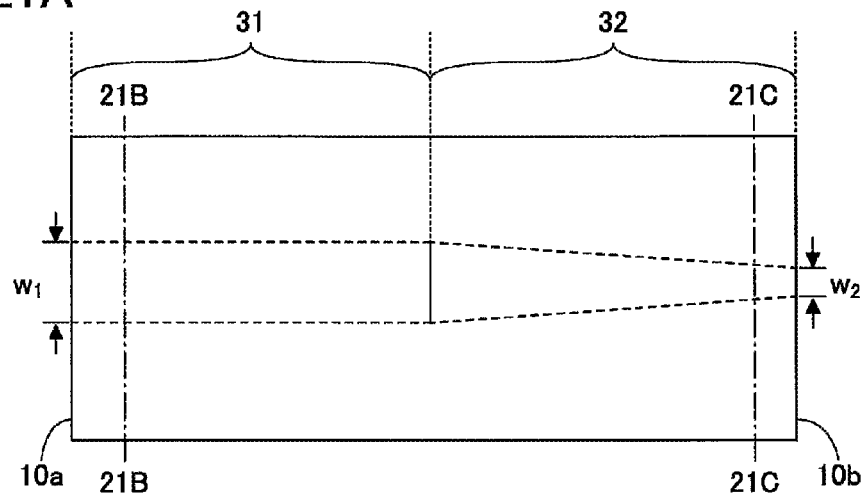
FIGS. 21A to 21C are diagrams illustrating a semiconductor laser light source according to a fourth embodiment.
Figure 21B:
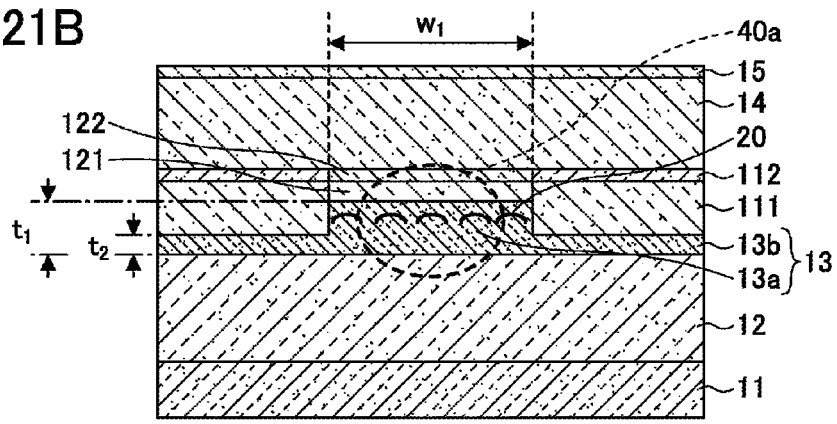
Figure 21C:
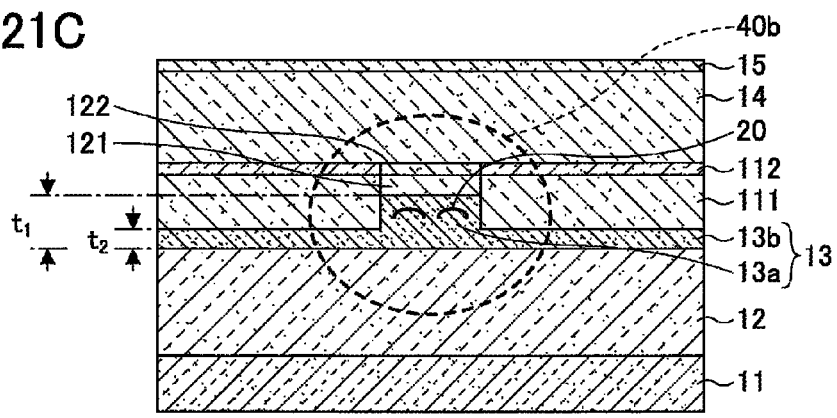

Next, a description is given of a semiconductor laser light source according to a fourth embodiment with reference to FIGS. 21A to 21C. FIG. 21A is a top view of the semiconductor laser light source according to the second embodiment. FIG. 21B is a sectional view cut along cut along a dash-dot line 21B-21B of FIG. 21A, and FIG. 21C is a sectional view cut along a dash-dot line 21C-21C of FIG. 21A.

As illustrated in FIGS. 21A to 21C, the semiconductor laser light source according to the fourth embodiment includes the lower cladding layer 12 and the waveguide layer 13 formed over the semiconductor substrate 11. The waveguide layer 13 includes a core area 13a for optically guiding electromagnetic waves and rib areas 13b disposed on either side of the core area 13a. A spacer layer 121 and a cap layer 122 are formed on the core area 13a. An intermediate cladding layer 111 and a block layer 112 are formed on the rib areas 13b. The upper cladding layer 14 and the contact layer 15 are formed in layers in this order on the cap layer 122 on the core area 13a and on the block layer 112 on the rib areas 13b.

The semiconductor substrate 11 is formed of an n-type GaAs substrate, and the lower cladding layer 12 is formed of n-type AlGaAs. In the waveguide layer 13, an InAs/GaAs quantum dot active layer 20 is formed on the core area 13a but the InAs/GaAs quantum dot active layer 20 is not formed on the rib areas 13b. Hence, in the waveguide layer 13, a thickness $t_1$ of the core area 13a is greater than a thickness $t_2$ of the rib areas 13b.

The upper cladding layer 14 is formed of p-type AlGaAs, and the contact layer 15 is formed of p-type GaAs. The intermediate cladding layer 111 is formed of p-type AlGaAs, and the block layer 112 is formed of n-type GaAs. The spacer layer 121 is formed of p-type AlGaAs, and the cap layer 122 is formed of p-type GaAs. Note that though not illustrated in FIGS. 21A to 21C, an upper electrode is formed in a predetermined area of the contact layer 15, and a lower electrode is formed on a rear surface of the semiconductor substrate 11.

The following illustrates a spot size of the light emitted by the semiconductor laser light source according to the fourth embodiment. Specifically, a relationship between the spot size of laser light and the thickness of the spacer layer 121 is simulated, based on the model illustrated in FIG. 22A. The model illustrated in FIG. 22A includes a layer corresponding to the waveguide layer 13 being formed on an AlGaAs layer having a thickness of 6500 nm corresponding to the lower cladding layer 12. The layer corresponding to the waveguide layer 13 includes an area made of GaAs with a thickness of 400 nm corresponding to the core area 13a and areas made of GaAs with a thickness of 50 nm corresponding to the rib areas 13b.

A layer corresponding to the spacer layer 121 and a layer corresponding to the cap layer 122 are formed in layers in the area serving as the core area 13a. The layer corresponding to the spacer layer 121 is formed of AlGaAs having a thickness range of 50 to 500 nm, and the layer corresponding to the cap layer 122 is formed of GaAs having a thickness of 20 nm.

A layer corresponding to the intermediate cladding layer 111 and a layer corresponding to the block layer 112 are formed in layers in the areas corresponding to the rib areas 13b. The layer corresponding to the intermediate cladding layer 111 is formed of AlGaAs having a thickness range of 400 to 850 nm, and the layer corresponding to the block layer 112 is formed of GaAs having a thickness of 20 nm.

A layer corresponding to the upper cladding layer 14 is formed on the layer corresponding to the cap layer 122 on the core area 13a and is also formed on the block layer 112 in the areas corresponding to the rib areas 13b. The layer corresponding to the upper cladding layer 14 is formed of AlGaAs having a thickness of 2300 nm.

The simulation has examined the spot size obtained in accordance with the thickness of the layer corresponding to the spacer layer 121 being changed from 50 to 500 nm. Note that the Al composition ratio and the stripe width (the width of the core area 13a) in AlGaAs corresponding to the lower cladding layer 12 and the upper cladding layer 14 are changed.

Figures 22A, 22B:
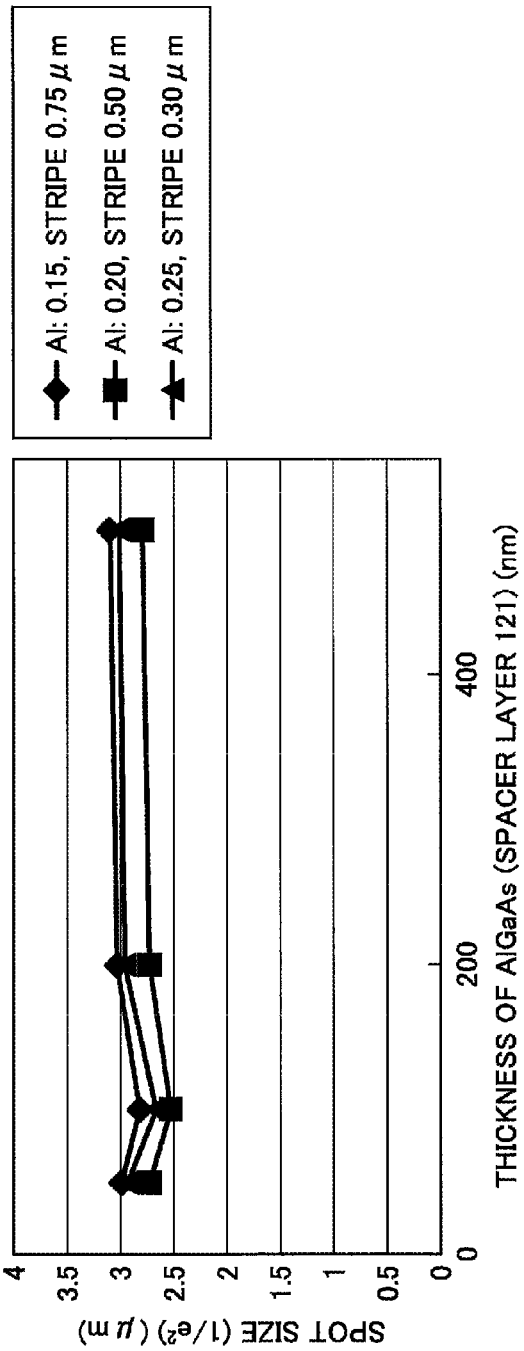
FIGS. 22A and 22B are diagrams illustrating simulation of the semiconductor laser light source according to the fourth embodiment.

As illustrated in FIG. 22B, little change has been detected by changing the thickness of the layer corresponding to the spacer layer 121.

Fabrication Method of Semiconductor Laser Light Source

The following illustrates a fabrication method of the semiconductor laser light source according to the fourth embodiment.

Figure 23A:
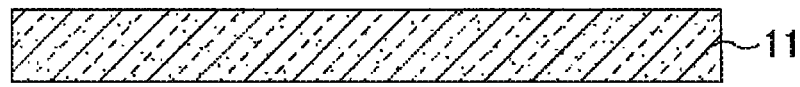
FIGS. 23A to 23C are first process drawings illustrating a fabrication method of the semiconductor laser light source according to the fourth embodiment.

As illustrated in FIG. 23A, a semiconductor substrate 11 formed of an n-type GaAs substrate is initially prepared.

Figure 23B:
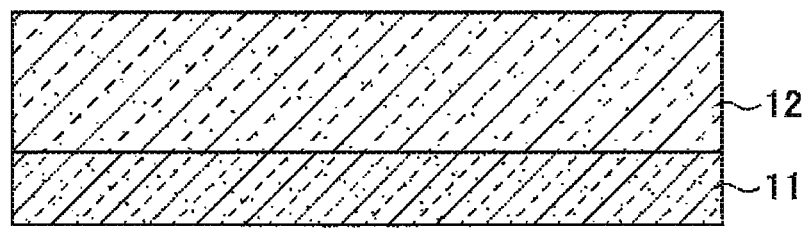

As illustrated in FIG. 23B, a not-illustrated buffer layer and a lower cladding layer 12 each made of an n-type AlGaAs are epitaxially grown by MBE over the semiconductor substrate 11. A thickness of the not-illustrated buffer layer is 300 nm, and the buffer layer is doped with Si as an n-type dopant element at a concentration of $2\times10^{18}$ cm$^{-3}$. The lower cladding layer 12 is made of n-type $Al_{0.15}Ga_{0.85}As$ having a thickness of 2500 nm. The lower cladding layer 12 is doped with Si as an n-type dopant element at a concentration of $5\times10^{17}$ cm$^{-3}$.

Figure 23C:
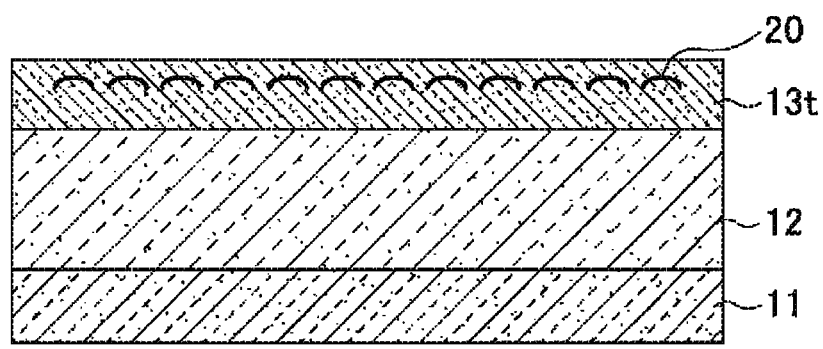

As illustrated in FIG. 23C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, an InAs/GaAs quantum dot active layer 20 having a thickness of 320 nm, and an upper GaAs layer having a thickness of 30 nm on the lower cladding layer 12. Note that the InAs/GaAs quantum dot active layer 20 is made by forming eight quantum dot layers with 40 nm period. Further, a central part of the GaAs layer having 10 nm that is formed in each of intervals between the eight quantum dot layers is doped with Be as a p-type dopant element at a concentration of $5\times10^{17}$ cm$^{-3}$.

Figure 24A:
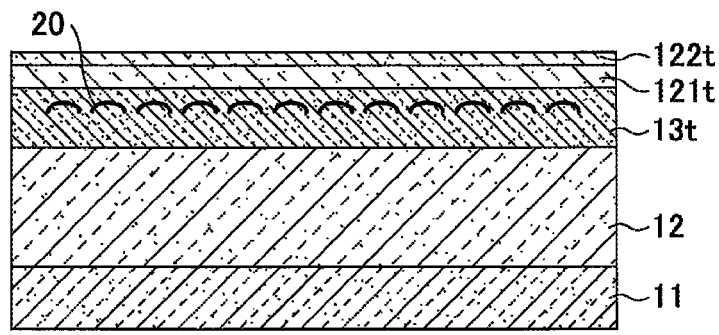
FIGS. 24A to 24C are second process drawings illustrating the fabrication method of the semiconductor laser light source according to the fourth embodiment.

Next, as illustrated in FIG. 24A, a p-type AlGaAs film 121t for forming a spacer layer 121 and a p-type GaAs film 122t for forming a cap layer 122 are epitaxially grown in layers by MBE on the waveguide forming film 13t. Note that in the semiconductor laser light source according to the third embodiment, the p-type AlGaAs film 121t may also be referred to as a spacer forming film and similarly, the p-type GaAs film 122t may also be referred to as a cap forming film. The p-type AlGaAs film 121t is made of p-type $Al_{0.15}Ga_{0.85}As$ having a thickness of approximately 200 nm.

The p-type AlGaAs film 121t is doped with Be as a p-type dopant element at a concentration of $1\times10^{18}$ cm$^{-3}$. The p-type GaAs film 122t is made of p-type GaAs having a thickness of approximately 20 nm. The p-type GaAs film 122t is doped with Be as a p-type dopant element at a concentration of $1\times10^{18}$ cm$^{-3}$.

Figure 24B:
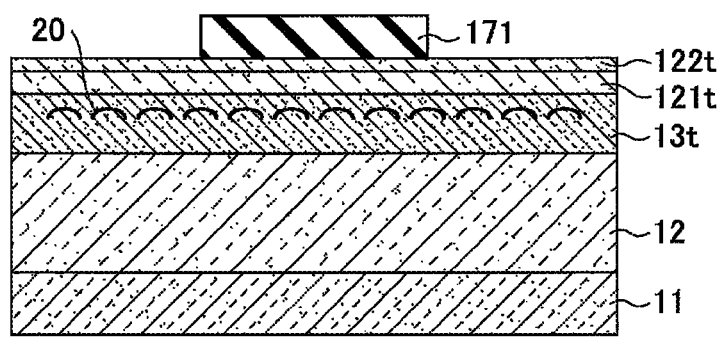

Next, as illustrated in FIG. 24B, a hard mask 171 is formed corresponding to a shape of the stripe that is the core area 13a to serve as an optical waveguide. Specifically, a SiO$_2$ film is deposited on the p-type GaAs film 122t by CVD in order to form the hard mask 171 on the p-type GaAs film 122t. A photoresist is applied to the SiO$_2$ film, and the photoresist applied SiO$_2$ film is exposed and developed by an exposure system to form a not-illustrated resist pattern in an area in which the hard mask 171 is formed. The SiO$_2$ film in other areas having no resist pattern formed is subsequently removed by etching. The not-illustrated resist pattern is thereafter removed by an organic solvent or the like. The hard mask 171 is thus formed in an area corresponding to the core area 13a of the waveguide layer 13. Note that the hard mask 171 may be formed of SiON, SiN, or the like other than SiO$_2$.

Figure 24C:
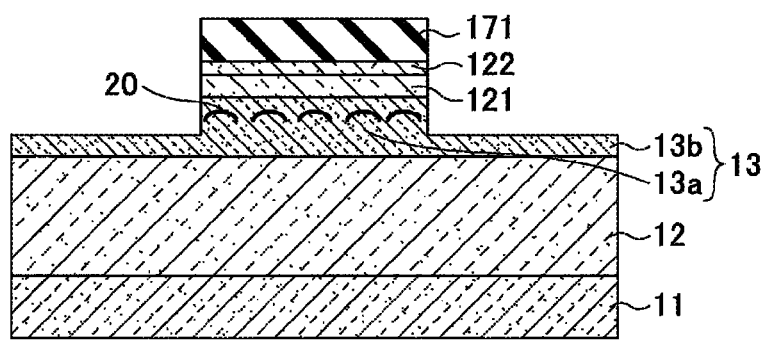

Next, as illustrated in FIG. 24C, the p-type GaAs film 122t and the p-type AlGaAs film 121t in the areas where no hard mask 171 is formed are removed by dry etching or the like, and the waveguide forming film 13t is subsequently removed until the thickness of the waveguide forming film 13t reaches 50 nm. The InAs/GaAs quantum dot active layer 20 is removed from the areas in which no hard mask 171 is formed so as to obtain the rib areas 13b. As a result, in the area in which the hard mask 171 is formed, the cap layer 122 is formed of the remaining p-type GaAs film 122t and the spacer layer 121 is formed of the remaining p-type AlGaAs film 121t. Further, the core area 13a having the InAs/GaAs quantum dot active layer 20 is formed of the remaining waveguide forming film 13t. The waveguide layer 13 having the core area 13a and the rib areas 13b is thus obtained.

Figure 25A:
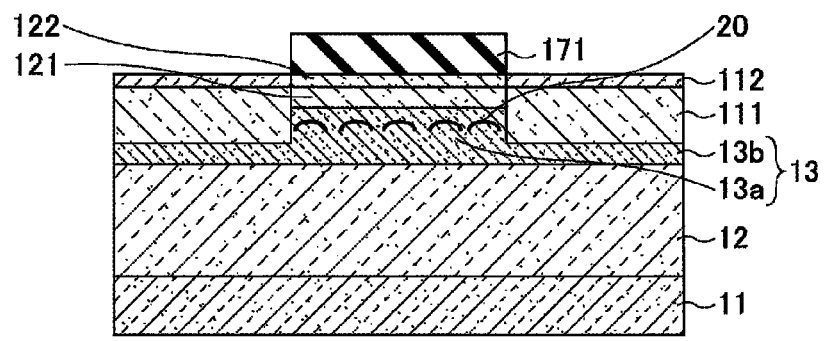
FIGS. 25A to 25C are third process drawings illustrating the fabrication method of the semiconductor laser light source according to the fourth embodiment.

Next, as illustrated in FIG. 25A, p-type AlGaAs serving as the intermediate cladding layer 111 and n-type GaAs serving as the block layer 112 are epitaxial grown in layers by MOVPE over the rib areas 13b of the waveguide layer 13. The intermediate cladding layer 111 is made of p-type Al$_{0.15}$Ga$_{0.85}$As having a thickness of approximately 330 nm. The intermediate cladding layer 111 is doped with Zn as a p-type dopant element at a concentration of $5\times10^{17}$ cm$^{-3}$. The block layer 112 is made of n-type GaAs having a thickness of 20 nm. The block layer 112 is doped with Si as an n-type dopant element at a concentration of $2\times10^{18}$ cm$^{-3}$. Note that the intermediate cladding layer 111 and the block layer 112 are formed by epitaxial growth. Accordingly, the intermediate cladding layer 111 and the block layer 112 will not thus be grown on the hard mask 171 having an amorphous crystal structure but are formed only on the rib areas 13b from which compound semiconductor is exposed.

Figure 25B:
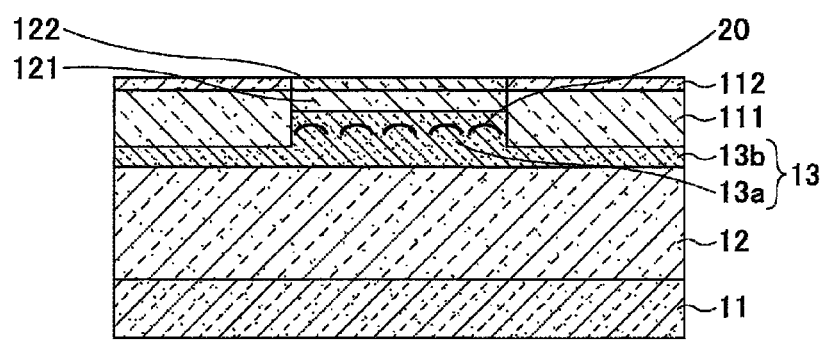

As illustrated in FIG. 25B, the hard mask 171 is subsequently removed by wet etching using a hydrofluoric acid or the like as etcher.

Figure 25C:
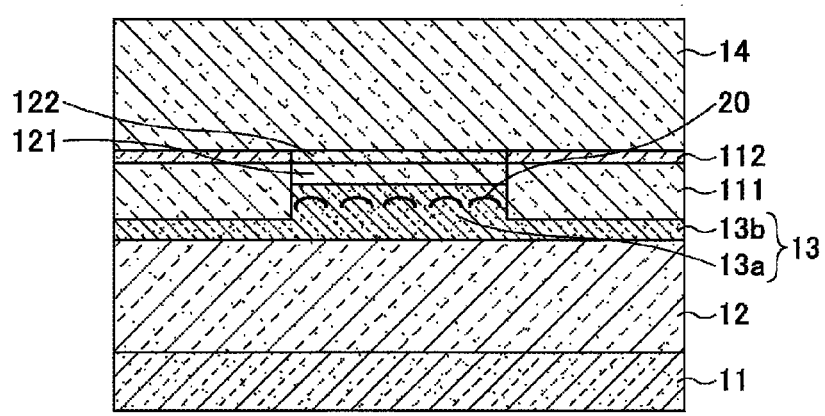

As illustrated in FIG. 25C, the upper cladding layer 14 is then epitaxially grown by MOVPE on the cap layer 122 on the core area 13a and on the block layer 112 on the rib areas 13b of the waveguide layer 13. The upper cladding layer 14 is made of p-type Al$_{0.15}$Ga$_{0.85}$As having a thickness of approximately 2000 nm. The upper cladding layer 14 is doped with Zn as a p-type dopant element at a concentration of $2\times10^{18}$ cm$^{-3}$.

Figure 26A:
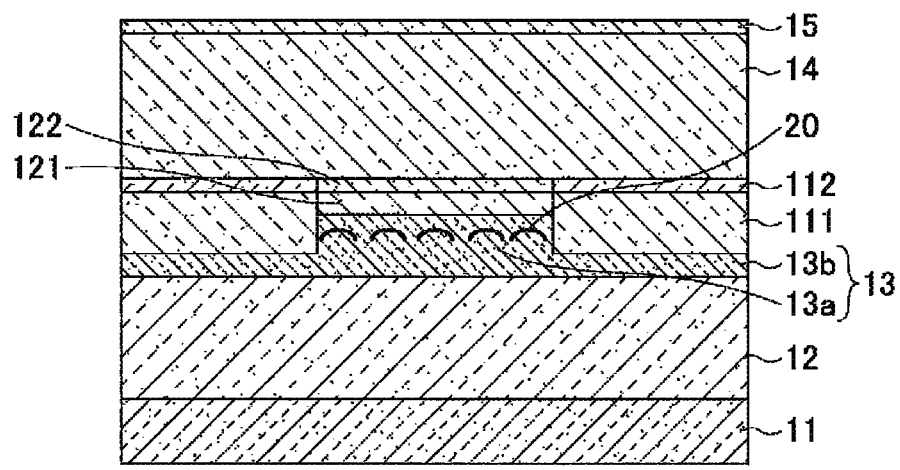
FIGS. 26A and 26B are fourth process drawings illustrating the fabrication method of the semiconductor laser light source according to the fourth embodiment.

As illustrated in FIG. 26A, the contact layer 15 is formed by MOVPE on the upper cladding layer 14. A thickness of the contact layer 15 is 300 nm, and the contact layer 15 is doped with Zn as a p-type dopant element at a concentration of $1\times10^{19}$ cm$^{-3}$.

Figure 26B:
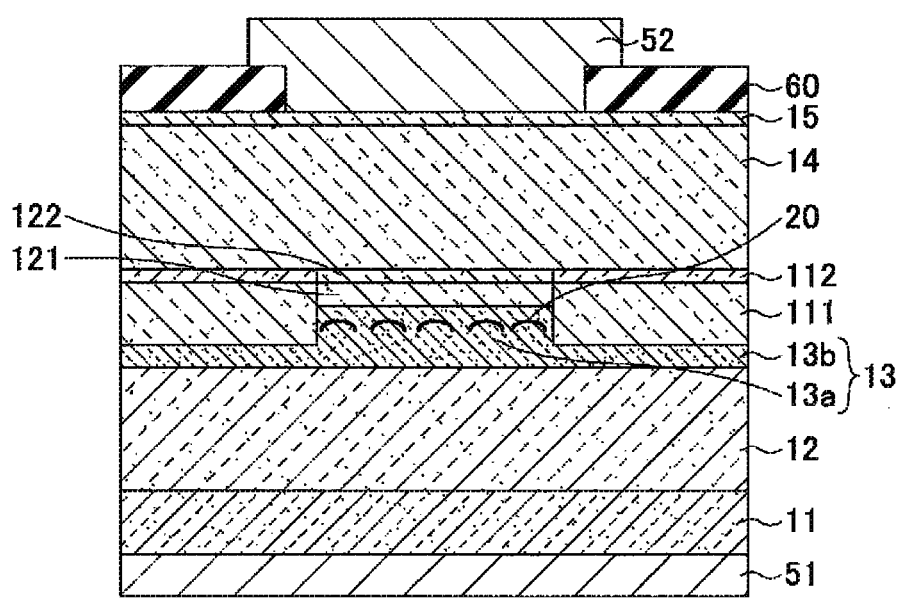

Next, as illustrated in FIG. 26B, an upper electrode 52 is formed in a predetermined area of a surface of the contact layer 15, and a lower electrode 51 is formed on a rear surface of the semiconductor substrate 11. Specifically, the lower electrode 51 is formed by depositing AuGe/Au on the rear surface of the semiconductor substrate 11 by vacuum evaporation or sputtering. Further, a SiN film for forming a protective film 60 is deposited on the contact layer 15, and an opening having a shape corresponding to the shape of the stripe is subsequently formed in the SiN film, thereby forming the protective film 60. The contact layer 15 is exposed via the opening in the protective film 60, and a Au/Zn/Au film is subsequently deposited in the predetermined area by vacuum evaporation or the like, thereby forming the upper electrode 52.

Compared to the second embodiment, the fourth embodiment may be able to control process induced damage on the quantum dot layer. Although a lateral side of the AlGaAs layer serving as the spacer layer is exposed as a surface of the stripe formed of a quantum dot active layer, the exposed side is only a limited area. Accordingly, the upper cladding layer 14 may be regrown with only limited effect of AlGaAs oxidation.

Note that in the fourth embodiment, the n-type and p-type may be reversed; however, the effect of the current block layer, which is disposed on the n-type substrate in the fourth embodiment, is superior to the current block layer in the second embodiment. Note that the illustration of the fabrication method of the semiconductor laser light source in the fourth embodiment other than those described above may be similar to the illustration of the fabrication method in the first embodiment.

FIFTH EMBODIMENT

Semiconductor Laser Light Source

Next, a semiconductor device according to a fifth embodiment is described. Compared to the semiconductor laser light source according to the second embodiment, the semiconductor laser light source according to the fifth embodiment has a structure having the Al composition ratio in AlGaAs forming the intermediate cladding layer 111 being 0.05 to 0.1 greater than the Al composition ratio in AlGaAs forming the lower cladding layer 12 and the upper cladding layer 14.

The following illustrates a spot size of the light emitted by the semiconductor laser light source according to the fifth embodiment. Specifically, a relationship between the spot size of laser light and the thickness of the intermediate cladding layer 111 is simulated, based on the model illustrated in FIG. 27A. The model illustrated in FIG. 27A includes layer corresponding to the waveguide layer 13 formed on an AlGaAs layer having a thickness of 6500 nm corresponding to the lower cladding layer 12. The layer corresponding to the waveguide layer 13 includes an area made of GaAs with a thickness of 400 nm corresponding to the core area 13a and areas made of GaAs with a thickness of 50 nm corresponding to the rib areas 13b.

A layer corresponding to the intermediate cladding layer 111 and a layer corresponding to the block layer 112 are formed in layers in the areas corresponding to the rib areas 13b. The layer corresponding to the intermediate cladding layer 111 is formed of AlGaAs having a thickness of 330 nm or 300 nm, and the layer corresponding to the block layer 112 is formed of GaAs having a thickness of 20 nm or 50 nm. The sum of the thickness of the layer corresponding to the intermediate cladding layer 111 and the thickness of the layer corresponding to the block layer 112 is 350 nm.

A layer corresponding to the upper cladding layer 14 is formed over the area corresponding to the core area 13a and is also formed on the layer corresponding to the block layer 112 over the areas corresponding to the rib areas 13b. The layer corresponding to the upper cladding layer 14 is formed of AlGaAs having a thickness of 2300 nm.

The simulation has examined the spot size obtained in accordance with the Al composition ratio of the layer corresponding to the intermediate cladding layer 111 being changed from 0.1 to 0.35. Note that the thickness of the layer corresponding to the block layer 112 and the thickness of the layer corresponding to the intermediate cladding layer 111 are also changed.

Figures 27A, 27B:
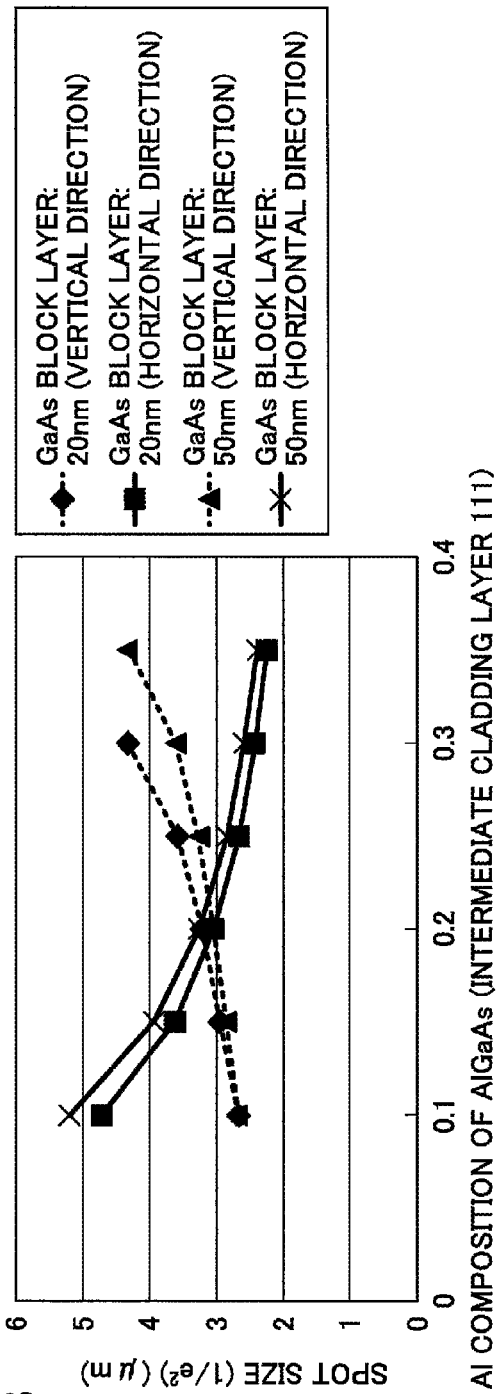
FIGS. 27A and 27B are diagrams illustrating simulation of a semiconductor laser light source according to a fifth embodiment.

As illustrated in FIG. 27B, when the Al composition ratio in AlGaAs forming the layer corresponding to the intermediate cladding layer 111 is increased, the spot size of the laser light is enlarged in a vertical direction but is reduced in a horizontal direction. The Al composition ratio of the layer corresponding to the intermediate cladding layer 111 having the spot size of the laser light being approximately the same in the vertical direction and in the horizontal direction is greater than 0.15, and is 0.25 or less. The Al composition ratio in the intermediate cladding layer 111 may thus be preferably greater than the Al composition ratio in each of the lower cladding layer 12 and the upper cladding layer 14. In addition, it is preferable that the difference in the Al composition ratio between the intermediate cladding layer 111 and each of the lower cladding layer 12 and the upper cladding layer 14 be 0.1 or less.

Fabrication Method of Semiconductor Laser Light Source

The following illustrates a fabrication method of the semiconductor laser light source according to the fifth embodiment.

Figure 28A:
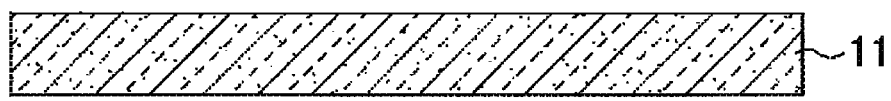
FIGS. 28A to 28C are first process drawings illustrating a fabrication method of the semiconductor laser light source according to the fifth embodiment.
Figure 28B:
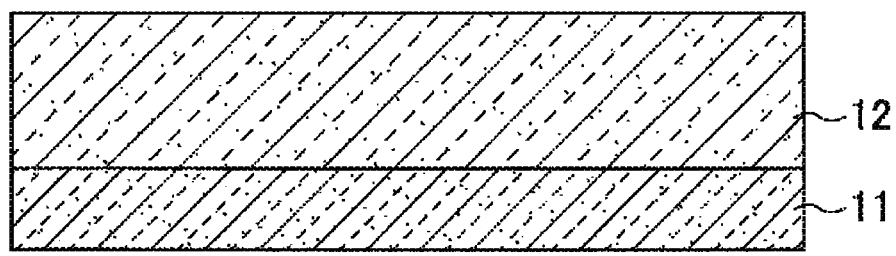

As Illustrated in FIG. 28A, a semiconductor substrate 11 formed of an n-type GaAs substrate is initially prepared.

As illustrated an FIG. 8B, a not-illustrated buffer layer and a lower cladding layer 12 each made of an n-type AlGaAs are epitaxially grown by MBE over the semiconductor substrate 11. A thickness of the not-illustrated buffer layer is 300 nm, and the buffer layer is doped with Si as an n-type dopant element at a concentration of $2\times10^{18}$ cm$^{-3}$. The lower cladding layer 12 is made of n-type $Al_{0.15}GA_{0.85}As$ having a thickness of 2500 nm. The lower cladding layer 12 is doped with Si as an n-type dopant element at a concentration of $5\times10^{17}$ cm$^{-3}$.

Figure 28C:
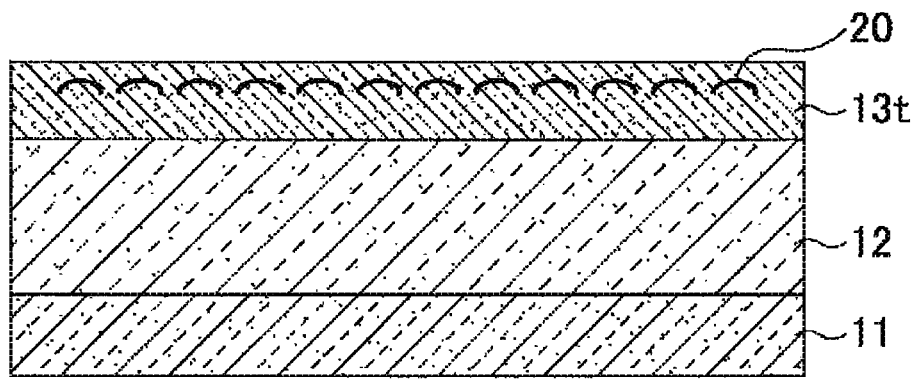

As illustrated in FIG. 28C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, an InAs/GaAs quantum dot active layer 20 having a thickness of 320 nm, and an upper GaAs layer having a thickness of 30 nm on the lower cladding layer 12. Note that the InAs/GaAs quantum dot active layer 20 is made by forming eight quantum dot layers with a 40 nm period. Further, a central part of the GaAs layer having 10 nm that is formed in each of intervals between the eight quantum dot layers is doped with Be as a p-type dopant element at a concentration of $5\times10^{17}$ cm$^{-3}$.

Figure 29A:
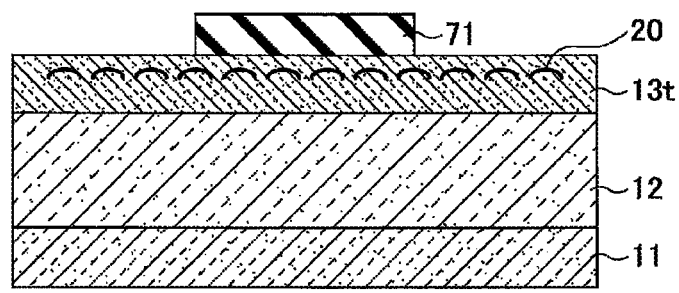
FIGS. 29A to 29C are second process drawings illustrating the fabrication method of the semiconductor laser light source according to the fifth embodiment.

Next, as illustrated in FIG. 29A, a hard mask 71 is formed corresponding to a shape of the stripe that is the core area 13a to serve as an optical waveguide. Specifically, a SiO$_2$ film is deposited on the waveguide forming film 13t by CVD in order to form the hard mask 71 on the waveguide forming film 13t. A photoresist is applied to the SiO$_2$ film, and the photoresist applied SiO$_2$ film is exposed and developed by an exposure system to form a not-illustrated resist pattern in an area in which the hard mask 71 is formed. The SiO$_2$ film in other areas having no resist pattern formed is subsequently removed by etching. The not-illustrated resist pattern is thereafter removed by an organic solvent or the like. The hard mask 71 is thus formed in an area corresponding to the core area 13a of the waveguide layer 13. Note that the hard mask 71 may be formed of SiON, SiN, or the like other than SiO$_2$.

Figure 29B:
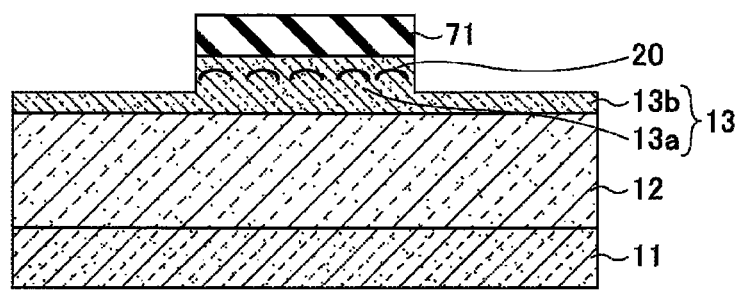

Next, the waveguide forming film 13t in the area in which no hard mask 71 is formed is removed by dry etching so that the thickness of the waveguide forming film 13t is 50 nm, as illustrated in FIG. 29B. The InAs/GaAs quantum dot active layer 20 is removed from the areas in which no hard mask 71 is formed so as to obtain the rib areas 13b. Note that the waveguide forming film 13t remains in the area in which the hard mask 71 is formed so as to form the core area 13a. The waveguide layer 13 having the core area 13a and the rib areas 13b is obtained as a result.

Figure 29C:
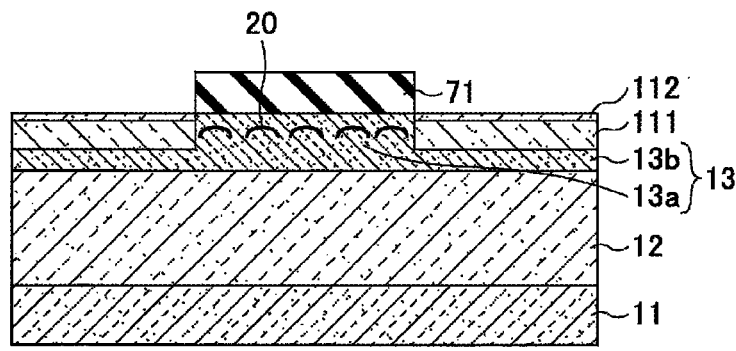

Next, as illustrated in FIG. 29C, p-type AlGaAs serving as the intermediate cladding layer 111 and n-type GaAs serving as the block layer 112 are epitaxial grown in layers by MOVPE over the rib areas 13b of the waveguide layer 13. The intermediate cladding layer 111 is made of p-type $Al_{0.2}Ga_{0.8}As$ having a thickness of approximately 330 nm. The intermediate cladding layer 111 is doped with Zn as a p-type dopant element at a concentration of $5\times10^{17}$ cm$^{-3}$. The block layer 112 is made of n-type GaAs having a thickness of 20 nm. The block layer 112 is doped with Si as an n-type dopant element at a concentration of $2\times10^{18}$ cm$^{-3}$. Note that the intermediate cladding layer 111 and the block layer 112 are formed by epitaxial growth. Accordingly, the intermediate cladding layer 111 and the block layer 112 will not thus be grown on the hard mask 71 having an amorphous crystal structure but are formed only on the rib areas 13b from which the compound semiconductor is exposed.

Figure 30A:
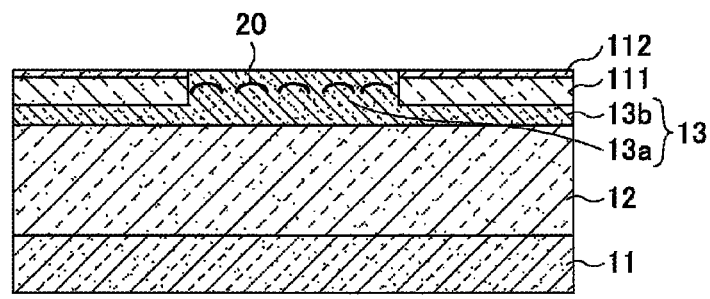
FIGS. 30A to 30C are third process drawings illustrating the fabrication method of the semiconductor laser light source according to the fifth embodiment.

As illustrated in FIG. 30A, the hard mask 71 is subsequently removed by wet etching using a hydrofluoric acid or the like as etcher.

Figure 30B:
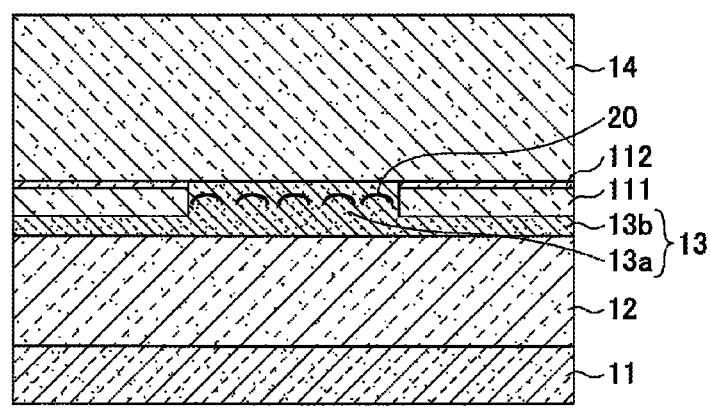

As illustrated in FIG. 30B, the upper cladding layer 14 is then epitaxially grown by MOVPE on the core area 13a and on the block layer 112 on the rib areas 13b of the waveguide layer 13. The upper cladding layer 14 is made of p-type $Al_{0.15}Ga_{0.85}As$ having a thickness of approximately 2000 nm. The upper cladding layer 14 is doped with Zn as a p-type dopant element at a concentration of $1\times10^{18}$ cm$^{-3}$.

Figure 30C:
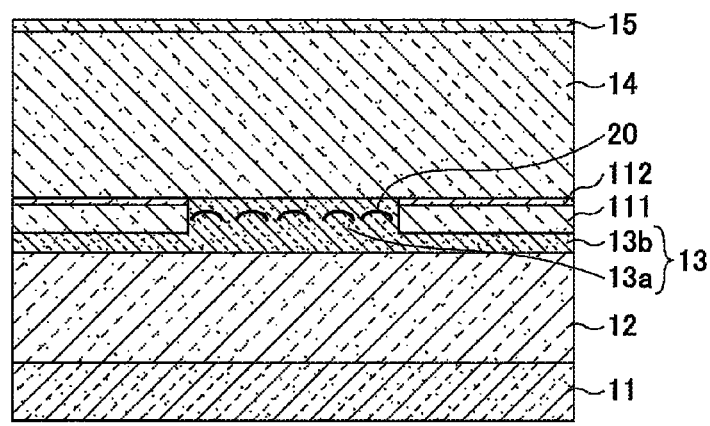

As illustrated in FIG. 30C, the contact layer 15 is formed by MOVPE on the upper cladding layer 14. A thickness of the contact layer 15 is 300 nm, and the contact layer 15 is doped with Zn as a p-type dopant element at a concentration of $1\times10^{19}$ cm$^{-3}$.

Figure 31:
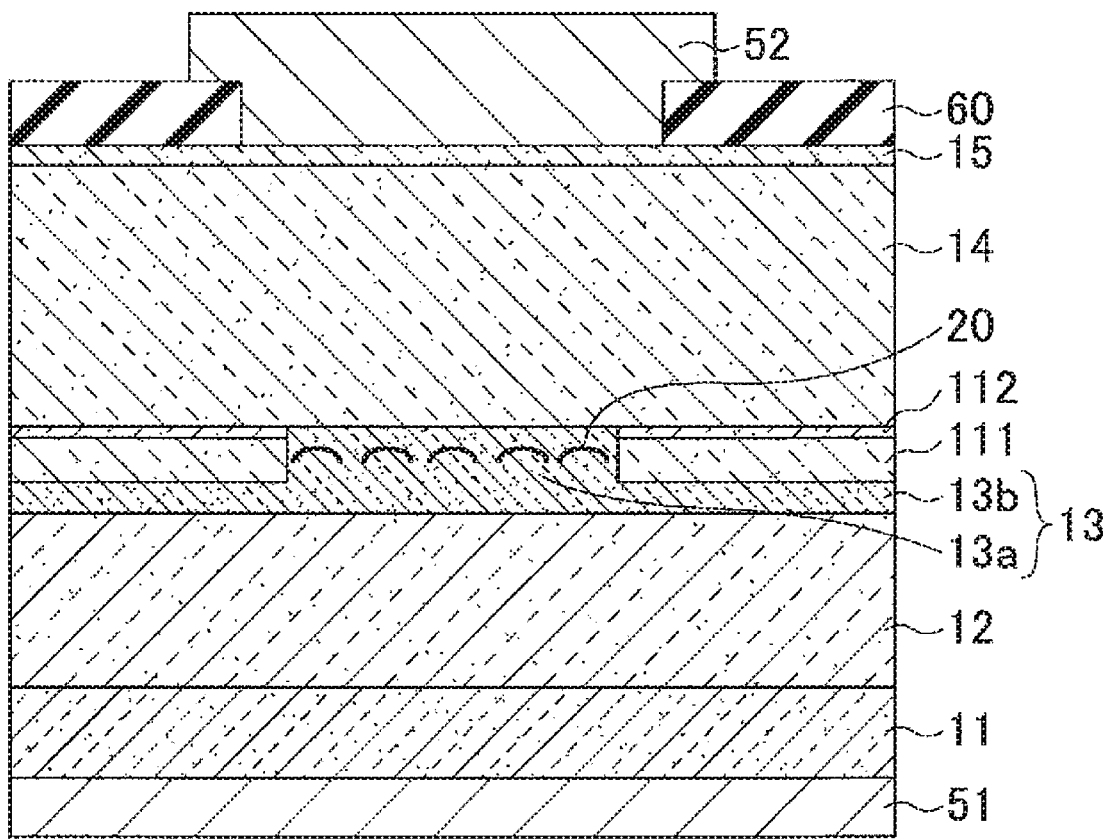
FIG. 31 is a fourth process drawing illustrating the fabrication method of the semiconductor laser light source according to the fifth embodiment.

Next, as illustrated in FIG. 31, an upper electrode 52 is formed in a predetermined area of a surface of the contact layer 15, and a lower electrode 51 is formed on a rear surface of the semiconductor substrate 11. Specifically, the lower electrode 51 is formed by depositing AuGe/Au on the rear surface of the semiconductor substrate 11 by vacuum evaporation or sputtering. Further, a SiN film for forming a protective film 60 is deposited on the contact layer 15, and an opening having a shape corresponding to the shape of the stripe is subsequently formed in the SiN film, thereby forming the protective film 60. The contact layer 15 is exposed via the opening in the protective film 60, and a Au/Zn/Au film is subsequently deposited in the predetermined area by vacuum evaporation or the like, thereby forming the upper electrode 52.

Note that in the fifth embodiment, the n-type and p-type may be reversed; however, the effect of the current block layer, which is disposed on the n-type substrate in the fifth embodiment, is superior to the current block layer in the second embodiment. Note that the illustration of the fabrication method of the semiconductor laser light source in the fourth embodiment other than those described above may be similar to the illustration of the fabrication method in the second embodiment.

SIXTH EMBODIMENT

Semiconductor Laser Light Source

Next, a semiconductor device according to a sixth embodiment is described. Compared to the semiconductor laser light source according to the fourth embodiment, the semiconductor laser light source according to the sixth embodiment has a structure having the Al composition ratio in AlGaAs forming the spacer layer 121 being 0.05 to 0.1 greater than the Al composition ratio in AlGaAs forming the lower cladding layer 12 and the upper cladding layer 14.

The following illustrates a spot size of the light emitted by the semiconductor laser light source according to the sixth embodiment. Specifically, a relationship between the spot size of laser light and the thickness of the spacer layer 121 is simulated, based on the model illustrated in FIG. 32A. The model illustrated in FIG. 32A includes a layer corresponding to the waveguide layer 13 being formed on an AlGaAs layer having a thickness of 6500 nm corresponding to the lower cladding layer 12. The layer corresponding to the waveguide layer 13 includes an area made of GaAs with a thickness of 400 nm corresponding to the core area 13a and areas made of GaAs with a thickness of 50 nm corresponding to the rib areas 13b.

A layer corresponding to the spacer layer 121 and a layer corresponding to the cap layer 122 are formed in layers in the area serving as the core area 13a. The layer corresponding to the spacer layer 121 is formed of AlGaAs having a thickness of 200 nm, and the layer corresponding to the cap layer 122 is formed of GaAs having a thickness of 50 nm.

A layer corresponding to the intermediate cladding layer 111 and a layer corresponding to the block layer 112 are formed in layers in the areas corresponding to the rib areas 13b. The layer corresponding to the intermediate cladding layer 111 is formed of AlGaAs having a thickness of 550 nm, and the layer corresponding to the block layer 112 is formed of GaAs having a thickness of 50 nm.

A layer corresponding to the upper cladding layer 14 is formed on the layer corresponding to the cap layer 122 on the core area 13a and is also formed on the block layer 112 in the areas corresponding to the rib areas 13b. The layer corresponding to the upper cladding layer 14 is formed of AlGaAs having a thickness of 2300 nm.

The simulation has examined the spot size obtained in accordance with the Al composition ratio of the layer corresponding to the spacer layer 121 being changed from 0.1 to 0.35.

Figures 32A, 32B:
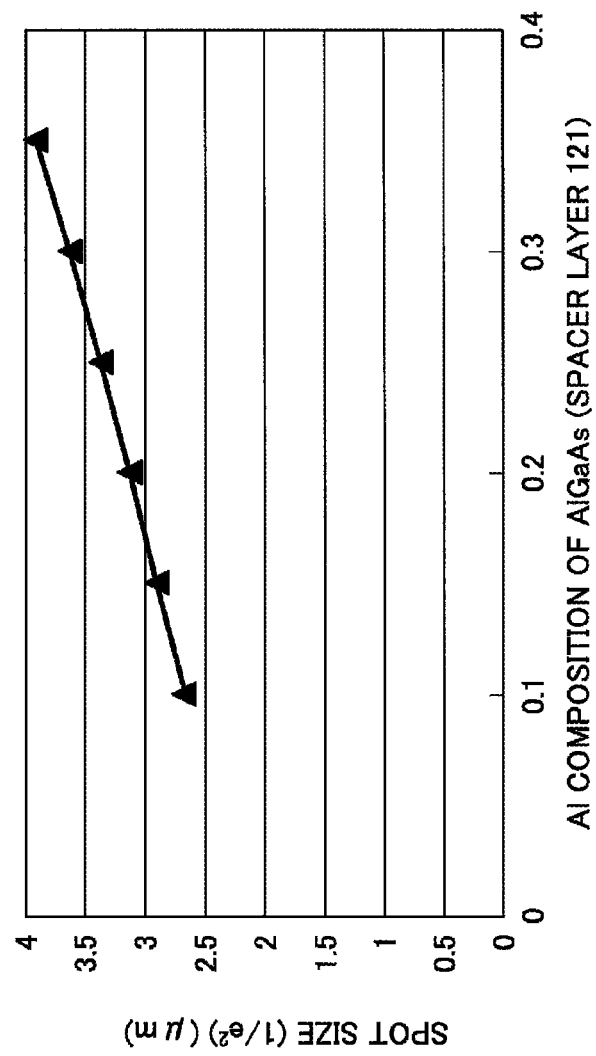
FIGS. 32A and 32B are diagrams illustrating simulation of a semiconductor laser light source according to a sixth embodiment.

As illustrated in FIG. 32B, when the Al composition ratio in AlGaAs forming the layer corresponding to the spacer layer 121 is increased, the spot size of the laser light is enlarged. The Al composition ratio of the layer corresponding to the spacer layer 121 having the spot size of approximately 3 µm is greater than 0.15, and is 0.25 or less. The Al composition ratio in the spacer layer 121 may thus be preferably greater than the Al composition ratio in each of the lower cladding layer 12 and the upper cladding layer 14. In addition, it is preferable that the difference in the Al composition ratio between the spacer layer 121 and each of the lower cladding layer 12 and the upper cladding layer 14 be 0.1 or less.

Fabrication Method of Semiconductor Laser Light Source

The following illustrates a fabrication method of the semiconductor laser light source according to the sixth embodiment.

Figure 33A:
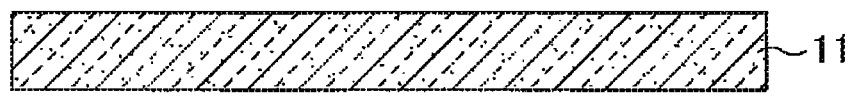
FIGS. 33A to 33C are first process drawings illustrating a fabrication method of the semiconductor laser light source according to the sixth embodiment.

As illustrated in FIG. 33A, a semiconductor substrate 11 formed of an n-type GaAs substrate is initially prepared.

Figure 33B:
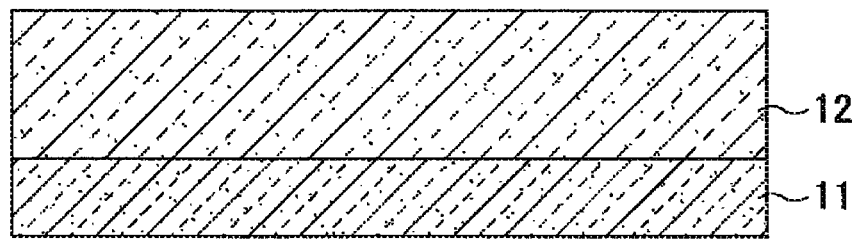

As illustrated in FIG. 33B, a not-illustrated buffer layer and a lower cladding layer 12 each made of an n-type AlGaAs are epitaxially grown by MBE over the semiconductor substrate 11. A thickness of the not-illustrated buffer layer is 300 nm, and the buffer layer is doped with Si as an n-type dopant element at a concentration of $2 \times 10^{18}$ cm$^{-3}$. The lower cladding layer 12 is made of n-type $Al_{0.15}Ga_{0.85}As$ having a thickness of 2500 nm. The lower cladding layer 12 is doped with Si as an n-type dopant element at a concentration of $5 \times 10^{17}$ cm$^{-3}$.

Figure 33C:
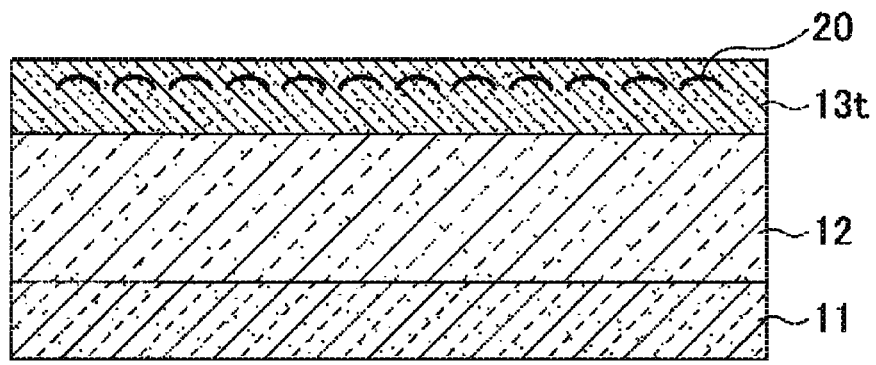

As illustrated in FIG. 33C, a waveguide forming film 13t having a thickness of 400 nm is epitaxially grown by MBE on the lower cladding layer 12. The waveguide forming film 13t grown on the lower cladding layer 12 includes the InAs/GaAs quantum dot active layer 20. The waveguide forming film 13t is formed by sequentially layering a lower GaAs layer having a thickness of 50 nm, InAs/GaAs quantum dot active layer 20 having a thickness of 320 nm, and an upper GaAs layer having a thickness of 30 nm on the lower cladding layer 12. Note that the InAs/GaAs quantum dot active layer 20 are made by forming eight quantum dot layers with 40 nm period. Further, a central part of the GaAs layer having 10 nm that is formed in each of intervals between the eight quantum dot layers is doped with Be as a p-type dopant element at a concentration of $5 \times 10^{17}$ cm$^{-3}$.

Figure 34A:
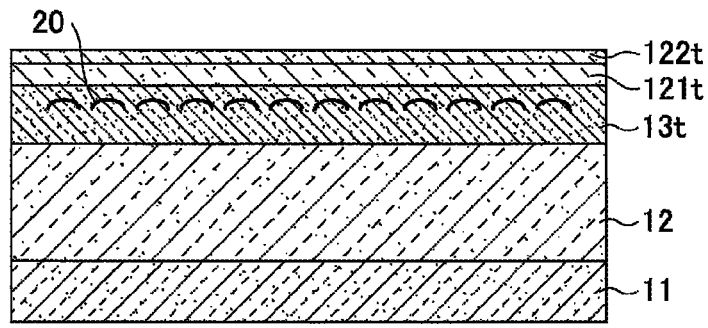
FIGS. 34A to 34C are second process drawings illustrating the fabrication method of the semiconductor laser light source according to the sixth embodiment.

Next, as illustrated in FIG. 34A, a p-type AlGaAs film 121t for forming a spacer layer 121 and a p-type GaAs film 122t for forming a cap layer 122 are epitaxially grown in layers by MBE on the waveguide forming film 13t. Note that in the semiconductor laser light source according to the sixth embodiment, the p-type AlGaAs film 121t may also be referred to as a spacer forming film and similarly, the n-type GaAs film 122t may also be referred to as a cap forming film. The p-type AlGaAs film 121t is made of p-type $Al_{0.2}Ga_{0.8}As$ having a thickness of approximately 200 nm. The p-type AlGaAs film 121t is doped with Be as a p-type dopant element at a concentration of $1 \times 10^{18}$ cm$^{-3}$. The p-type GaAs film 122t is made of p-type GaAs having a thickness of approximately 20 nm, The p-type GaAs film 122t is doped with Be as a p-type dopant element at a concentration of $1 \times 10^{18}$ cm$^{-3}$.

Figure 34B:
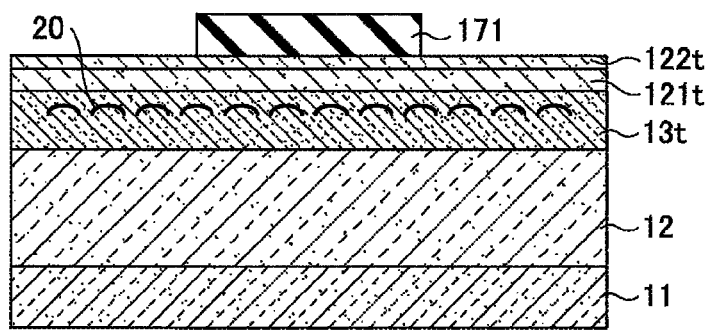

Next, as illustrated in FIG. 34B, a hard mask 171 is formed corresponding to a shape of the stripe that is the core area 13a to serve as an optical waveguide. Specifically, a SiO$_2$ film is deposited on the p-type GaAs film 122t by CVD in order to form the hard mask 171 on the p-type GaAs film 122t. A photoresist is applied to the SiO₂ film, and the photoresist applied SiO₂ film is exposed and developed by an exposure system to form a not-illustrated resist pattern in an area in which the hard mask 171 is formed. The SiO₂ film in other areas having no resist pattern formed is subsequently removed by etching. The not-illustrated resist pattern is thereafter removed by an organic solvent or the like. The hard mask 171 is thus formed in an area corresponding to the core area 13a of the waveguide layer 13. Note that the hard mask 171 may be formed of SiON, SiN, or the like other than SiO₂.

Figure 34C:
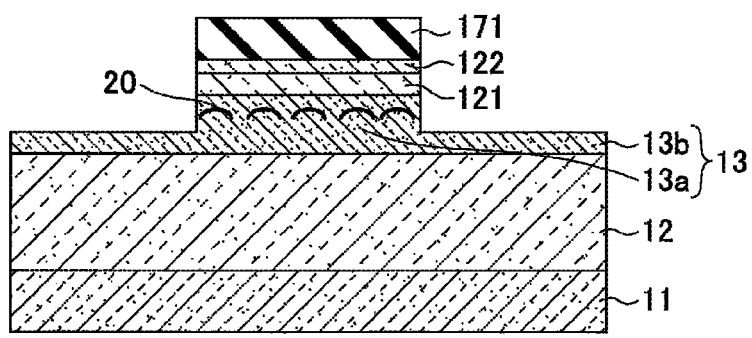

Next, as illustrated in FIG. 34C, the p-type GaAs film 122t and the p-type AlGaAs film 121t in the areas where no hard mask 171 is formed are removed by dry etching or the like, and the waveguide forming film 13t is subsequently removed until the thickness of the waveguide forming film 13t reaches 50 nm. The InAs/GaAs quantum dot active layer 20 is removed from the areas in which no hard mask 171 is formed so as to obtain the rib areas 13b. As a result, in the area in which the hard mask 171 is formed, the cap layer 122 is formed of the remaining p-type GaAs film 122t and the spacer layer 121 is formed of the remaining p-type AlGaAs film 121t. Further, the core area 13a having the InAs/GaAs quantum dot active layer 20 is formed of the remaining waveguide forming film 13t. The waveguide layer 13 having the core area 13a and the rib areas 13b is thus obtained.

Figure 35A:
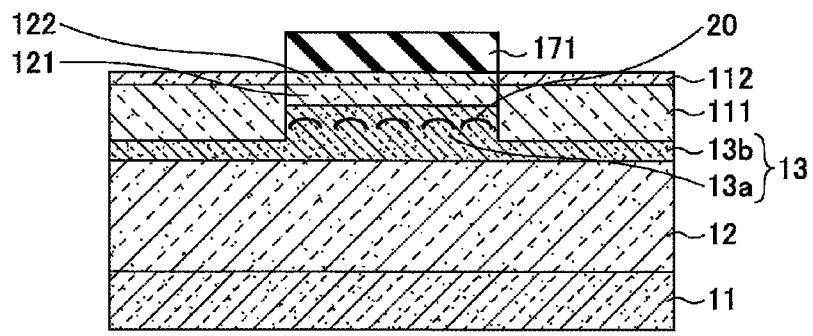
FIGS. 35A to 35C are third process drawings illustrating the fabrication method of the semiconductor laser light source according to the sixth embodiment.

Next, as illustrated in FIG. 35A, p-type AlGaAs serving as the intermediate cladding layer 111 and n-type GaAs serving as the block layer 112, are epitaxial grown in layers by MOVPE over the rib areas 13b of the waveguide layer 13. The intermediate cladding layer 111 is made of p-type $Al_{0.15}Ga_{0.85}As$ having a thickness of approximately 330 nm. The intermediate cladding layer 111 is doped with Zn as a p-type dopant element at a concentration of $5\times10^{17}$ cm$^{-3}$. The block layer 112 is made of n-type GaAs having a thickness of 20 nm. The block layer 112 is doped with Si as an n-type dopant element at a concentration of $2\times10^{18}$ cm$^{-3}$. Note that the intermediate cladding layer 111 and the block layer 112 are formed by epitaxial growth. Accordingly, the intermediate cladding layer 111 and the block layer 112 will not thus be grown on the hard mask 171 having an amorphous crystal structure but are formed only on the rib areas 13b from which the compound semiconductor is exposed.

Figure 35B:
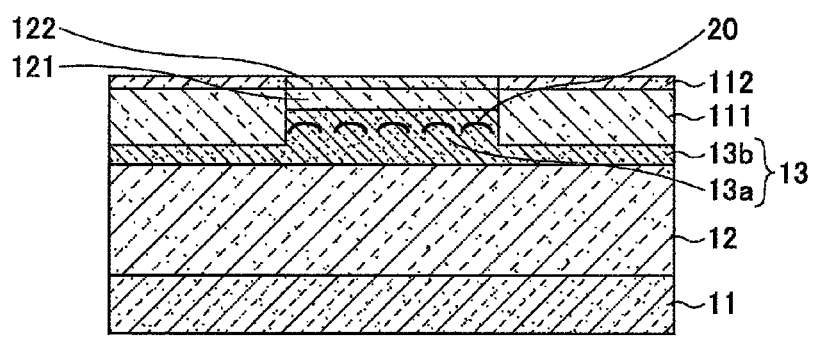

As illustrated in FIG. 35B, the hard mask 171 is subsequently removed by wet etching using a hydrofluoric acid or the like as etcher.

Figure 35C:
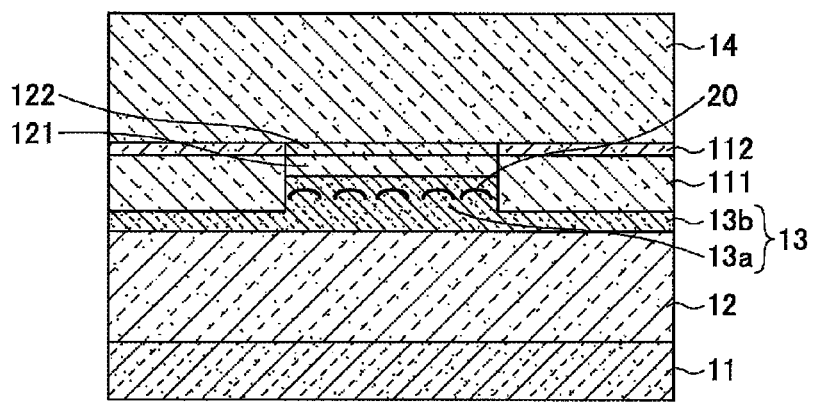

As illustrated in FIG. 35C, the upper cladding layer 14 is then epitaxially grown by MOVPE on the cap layer 122 on the core area 13a and on the block layer 112 on the rib areas 13b of the waveguide layer 13. The upper cladding layer 14 is made of p-type $Al_{0.15}Ga_{0.85}As$ having a thickness of approximately 2000 nm. The upper cladding layer 14 is doped with Zn as a p-type dopant element at a concentration of $1\times10^{18}$ cm$^{-3}$.

Figure 36A:
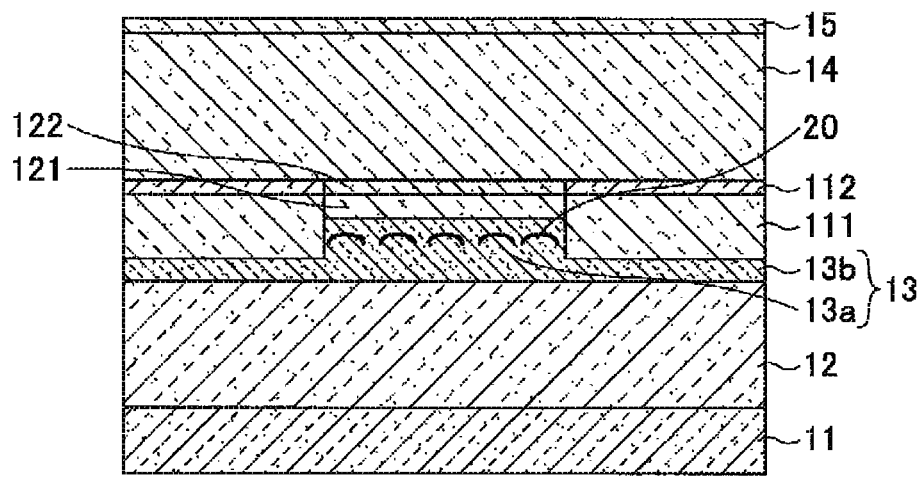
FIGS. 36A and 36B are fourth process drawings illustrating the fabrication method of the semiconductor laser light source according to the sixth embodiment.

As illustrated in FIG. 36A, the contact layer 15 is formed by MOVPE on the upper cladding layer 14. A thickness of the contact layer 15 is 300 nm, and the contact layer 15 is doped with Zn as a p-type dopant element at a concentration of $1\times10^{19}$ cm$^{-3}$.

Figure 36B:
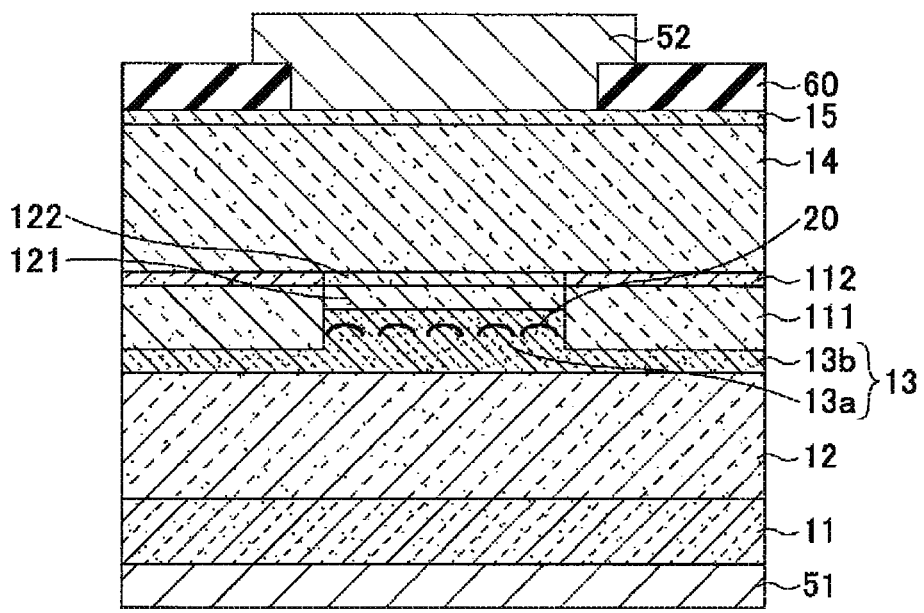

Next, as illustrated in FIG. 36B, an upper electrode 52 is formed in a predetermined area of a surface of the contact layer 15, and a lower electrode 51 is formed on a rear surface of the semiconductor substrate 11. Specifically, the lower electrode 51 is formed by depositing AuGe/Au on the rear surface of the semiconductor substrate 11 by vacuum evaporation or sputtering. Further, a SiN film for forming a protective film 60 is deposited on the contact layer 15, and an opening having a shape corresponding to the shape of the stripe is subsequently formed in the SiN film, thereby forming the protective film 60. The contact layer 15 is exposed via the opening in the protective film 60, and a Au/Zn/Au film is subsequently deposited in the predetermined area by vacuum evaporation or the like, thereby forming the upper electrode 52.

Note that in the sixth embodiment, the n-type and p-type may be reversed; however, the effect of the current block layer, which is disposed on the n-type substrate in the sixth embodiment, is superior to the current block layer in the fourth embodiment. Note that the illustration of the fabrication method of the semiconductor laser light source in the sixth embodiment other than those described above may be similar to the illustration of the fabrication method in the fourth embodiment.

The examples and embodiments have been described above in detail; however, it should not be construed that the present invention is limited to those specific examples and embodiments described above. Various changes or alternations may be made within the scope of the invention.

The disclosed embodiments may provide a semiconductor light source capable of reducing temperature dependency in a oscillation threshold or a drive current and being employed in silicon photonics.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor laser light source comprising:
   a semiconductor substrate formed of a semiconductor material of a first conductivity type;
   a lower cladding layer over the semiconductor substrate, the lower cladding layer being formed of the semiconductor material of the first conductivity type;
   a waveguide layer formed on the lower cladding layer; and
   an upper cladding layer over the waveguide layer, the upper cladding layer being formed of a semiconductor material of a second conductivity type, wherein
   the waveguide layer includes a core area through which light is guided and rib areas on either side of the core area, each of the rib areas being thinner than the core area, the core area having a quantum dot active layer, the rib areas having no quantum dot layer, wherein
   the waveguide layer forms a laser part and a spot size converter adjacent to the laser part, the spot size converter being configured to convert a spot size of the laser light, wherein
   in the waveguide layer, the core area in the laser part has a constant width, and the core area in the spot size converter has a taper width gradually narrowing from a side adjacent to the laser part toward an end of the spot size converter.

2. The semiconductor laser light source as claimed in claim 1, further comprising:

an intermediate cladding layer over the rib areas of the waveguide layer, the intermediate cladding layer being formed of the semiconductor material of the second conductivity type; and a block layer on the intermediate cladding layer, the block layer being formed of the semiconductor material of the first conductivity type, wherein the upper cladding layer is formed on the block layer on the rib areas of the waveguide layer.

3. The semiconductor laser light source as claimed in claim 1, further comprising:

a spacer layer in the core area of the waveguide layer, the spacer layer being formed of the semiconductor material of the second conductivity type; and a cap layer on the spacer layer, the cap layer being formed of the semiconductor material of the second conductivity type, wherein the upper cladding layer is formed on the cap layer in the core area of the waveguide layer.

4. The semiconductor laser light source as claimed in claim 1, wherein the semiconductor substrate is formed of a material containing GaAs, the lower cladding, layer is formed of a material containing AlGaAs, the quantum dot layer is formed of a material containing InAs and GaAs, and the upper cladding layer is formed of a material containing AlGaAs.

5. The semiconductor laser light source as claimed in claim 2, wherein the semiconductor substrate is formed of a material containing GaAs, the lower cladding, layer is formed of a material containing AlGaAs, the quantum dot layer is formed of a material containing InAs and GaAs, the upper cladding layer is formed of a material containing AlGaAs, the intermediate cladding layer is formed of a material containing AlGaAs, and the block layer is formed of a material containing GaAs.

6. The semiconductor laser light source as claimed in claim 5, wherein an Al composition ratio in the intermediate cladding layer is greater than an Al composition ratio in each of the lower cladding layer and the upper cladding layer.

7. The semiconductor laser light source as claimed in claim 3, wherein the semiconductor substrate is formed of a material containing GaAs, the lower cladding layer is formed of a material containing AlGaAs, the quantum dot layer is formed of a material containing InAs and GaAs, the upper cladding layer is formed of a material containing AlGaAs, the spacer layer is formed of a material containing AlGaAs, and the cap layer is formed of a material containing GaAs.

8. The semiconductor laser light source as claimed in claim 7, wherein an Al composition ratio in the spacer layer is greater than an Al composition ratio in each of the lower cladding layer and the upper cladding layer.

9. The semiconductor laser light source as claimed in claim 1, wherein the first conductivity type is an n-type, and the second conductivity is a p-type.

10. The semiconductor laser light source as claimed in claim 1, further comprising:

a lower electrode formed on a rear surface of the semiconductor substrate; and an upper electrode formed on the upper cladding, layer.

11. A method for fabricating a semiconductor laser light source, the method comprising:

forming a lower cladding layer over a semiconductor substrate, the lower cladding layer being formed of a semiconductor material of a first conductivity type, the semiconductor substrate being formed of the semiconductor material of the first conductivity type;

forming a waveguide forming film over the lower cladding layer, the waveguide forming film including a quantum dot layer;

forming a waveguide layer by partially removing the quantum dot layer of the waveguide forming film such that the formed waveguide layer includes a core area having the remaining quantum dot active layer and a rib area having no remaining quantum dot layer;

forming an upper cladding layer over the waveguide layer, the upper cladding layer being formed of a semiconductor material of a second conductivity type; and forming a laser part and a spot size converter adjacent to the laser part in the waveguide layer, the spot size converter being configured to convert a spot size of laser light, the core area in the laser part being formed to have a constant width, the core area in the spot size converter being formed to have a taper width gradually narrowing from a side adjacent to the laser part toward an end of the spot size converter.

12. The method as claimed in claim 11, further comprising:

forming, after the forming of the waveguide layer, an intermediate cladding layer over the rib area of the waveguide layer, the intermediate cladding layer being formed of the semiconductor material of the second conductivity type; and forming a block layer on the intermediate cladding layer, the block layer being formed of the semiconductor material of the first conductivity type, wherein the upper cladding layer is formed over the block layer on the rib area of the waveguide layer.

13. The method as claimed in claim 11, further comprising:

forming, after the forming of the waveguide forming film, a spacer forming film on the waveguide forming film, an intermediate cladding layer over the rib area of the waveguide layer, the spacer forming film being formed of the semiconductor material of the first conductivity type; and forming a cap forming film on the spacer forming film, the cap forming film being formed of the semiconductor material of the second conductivity type, wherein the forming of the waveguide layer includes partially removing the cap forming film and the spacer forming film from an area where the rib area is formed, such that a remaining cap forming film forms a cap layer and a remaining spacer forming film forms a spacer film.

14. The method as claimed in claim 11, wherein the forming of the waveguide layer includes forming a mask on the waveguide forming film, the mask being formed corresponding to a shape of the core area;

etching the waveguide forming film to remove the quantum dot layer of the waveguide forming film in an area in which no mask is formed; and removing the mask formed on the waveguide forming film.

15. The method as claimed in claim 11, wherein
the lower cladding layer and the waveguide forming film are formed by molecular beam epitaxy, and
the upper cladding layer is metalorganic vapor phase epitaxy.

16. The method as claimed in claim 12, wherein
the forming of the waveguide layer includes
forming a mask on the waveguide forming film, the mask being formed corresponding to a shape of the core area;
etching the quantum dot layer of the waveguide forming film in an area in which no mask is formed; and
forming the intermediate cladding layer and the block layer by metalorganic vapor phase epitaxy; and
removing the mask after the forming of the intermediate cladding layer and the forming of the block layer.

17. The method as claimed in claim 11, wherein
the semiconductor substrate is formed of a material containing GaAs,
the lower cladding, layer is formed of a material containing AlGaAs,
the quantum dot layer is formed of a material containing InAs and GaAs, and
the upper cladding layer is formed of a material containing AlGaAs.

18. The method as claimed in claim 11, further comprising:
forming a lower electrode on a rear surface of the semiconductor substrate; and
forming an upper electrode on the upper cladding layer.

* * * * *